United States Patent [19]
Nelson et al.

[11] Patent Number: 5,818,074
[45] Date of Patent: Oct. 6, 1998

[54] SMOOTH SWITCHING THYRISTOR

[75] Inventors: Richard E. Nelson, Meridian; David K. Umberger, Boise, both of Id.

[73] Assignee: Beacon Light Products, Inc., Meridian, Id.

[21] Appl. No.: 594,994

[22] Filed: Jan. 31, 1996

[51] Int. Cl.⁶ .......................... H01L 29/74; H01L 31/111
[52] U.S. Cl. .......................... 257/110; 257/164; 257/166
[58] Field of Search .................. 257/107, 109, 257/110, 119, 120, 132, 147, 152

[56] References Cited

U.S. PATENT DOCUMENTS

| | | | |
|---|---|---|---|
| 3,641,403 | 2/1972 | Nakata | 257/107 |
| 4,903,105 | 2/1990 | Najji | 257/149 |
| 5,461,242 | 10/1995 | Muraoka et al. | 257/136 |

FOREIGN PATENT DOCUMENTS

| | | |
|---|---|---|
| A 0298001 | 1/1989 | European Pat. Off. |
| 2128464 | 10/1972 | France |
| 4029121 | 3/1991 | Germany |
| 5335558 | 12/1993 | Japan |
| 8600469 | 1/1986 | WIPO |
| WO A 8600469 | 1/1986 | WIPO |

OTHER PUBLICATIONS

Patent Abstract of Japan, vol. 8, No. 95 (E–242) [1532]. May 2, 1984 & JP 59 014671 A (Nippon Denki K.K.), Jan. 25, 1984.

Patent Abstracts of Japan, vol. 7, No. 58 (E–163), Mar. 10, 1983 & JP 57 204163 A (Toyo Denki Seizo K.K.), Dec. 14, 1982.

*Primary Examiner*—Wael Fahmy
*Attorney, Agent, or Firm*—John R. Ley

[57] ABSTRACT

A semiconductor thyristor has multiple different semiconductor layers with regions arranged in predetermined configurations to cause a plasma of carriers to flow in an expanding volume over a finite time to reach a full conduction condition, after the thyristor is switched into a conductive condition. A smooth current or connectivity transition occurs between a nonconductive state and a conductive state, thereby eliminating the typical, more instantaneous and discontinuous on-switching conductivity transitions. The finite and increased time to reach the full conduction inherently reduces the di/dt effect created by switching the thyristor. The reduced di/dt substantially reduces the radiated and conductive interference signals generated by switching the thyristor. The growth in the size of the plasma is controlled using configurations of the semiconductor structure and doping profiles within the semiconductor layers.

20 Claims, 14 Drawing Sheets

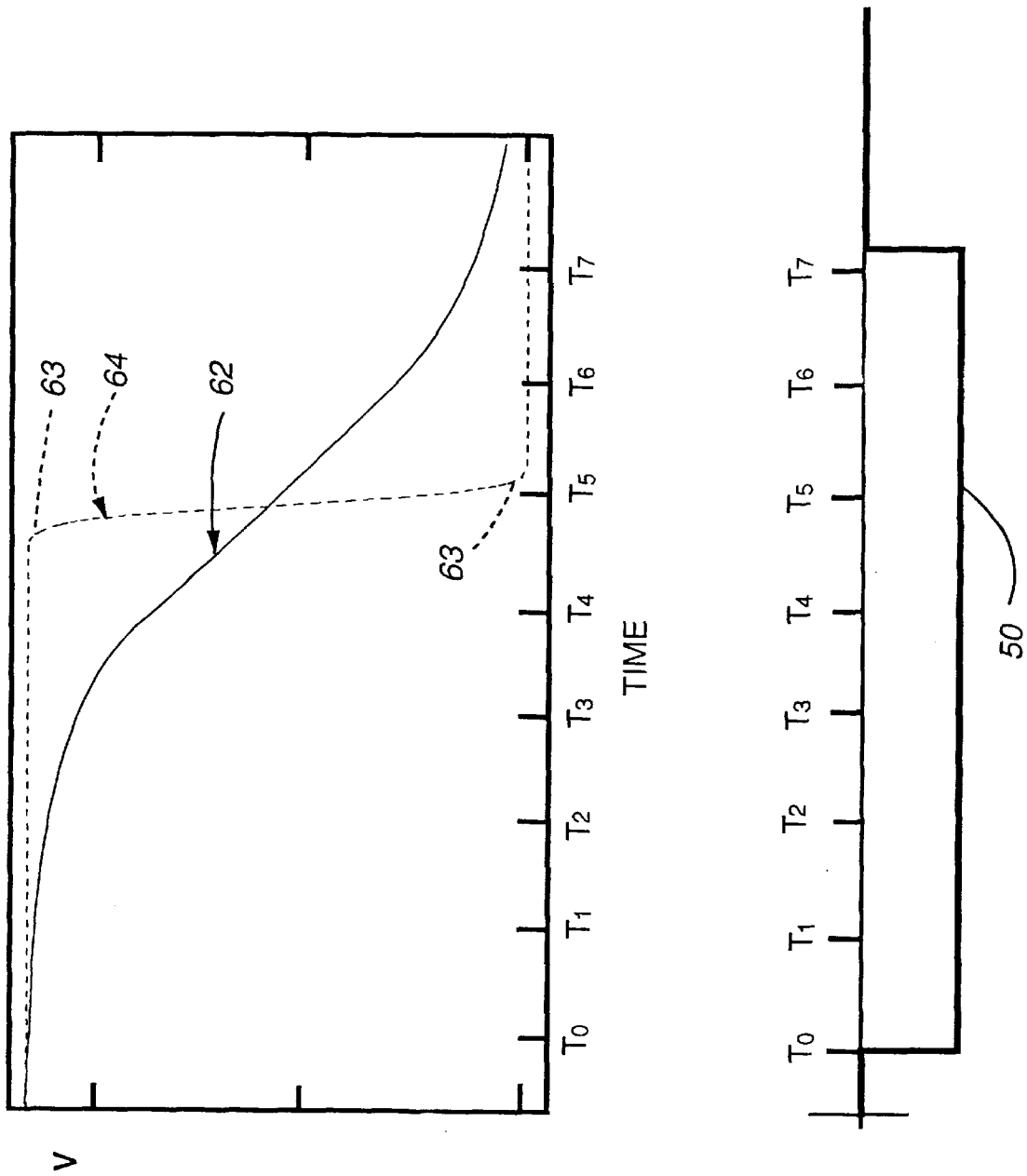

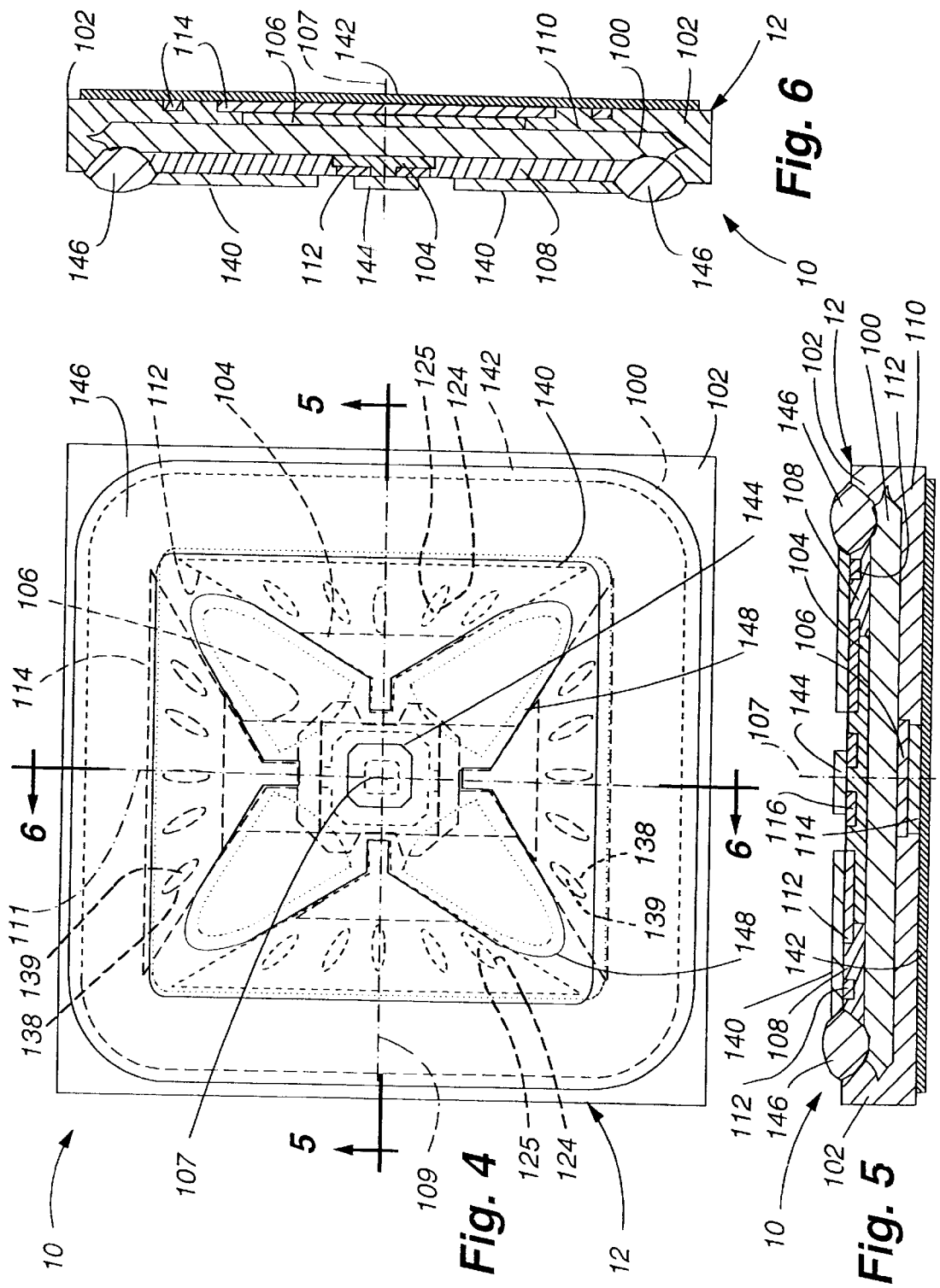

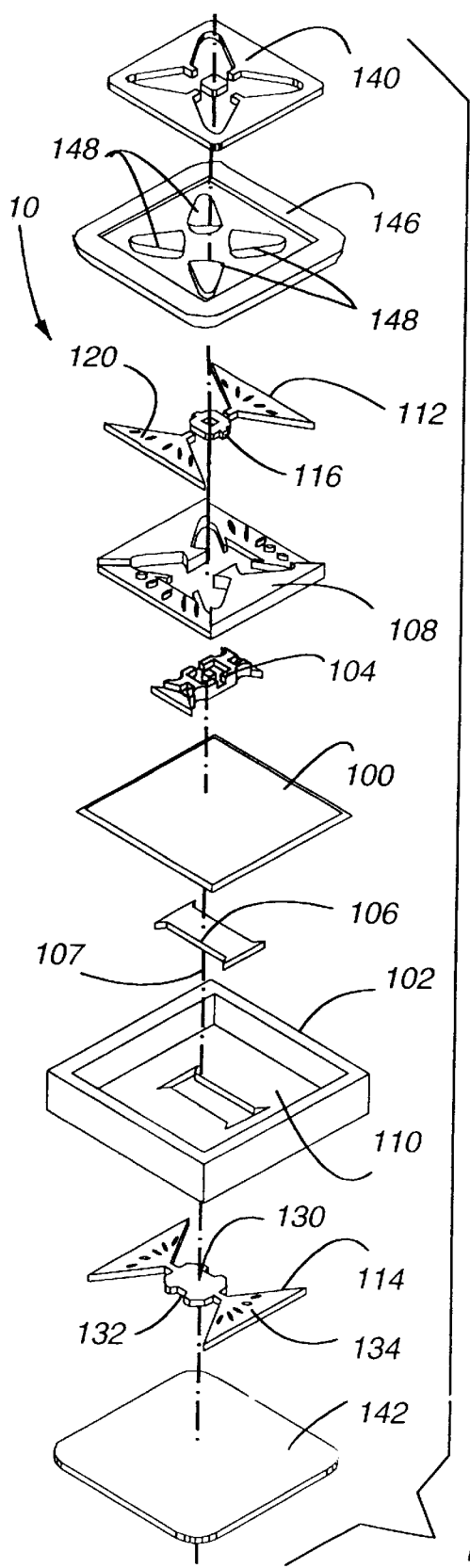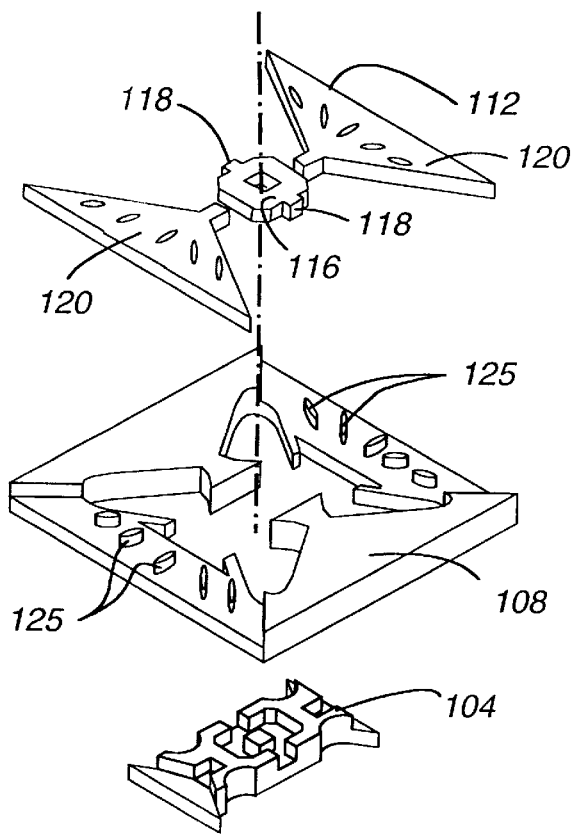
Fig. 7B
Fig. 7A

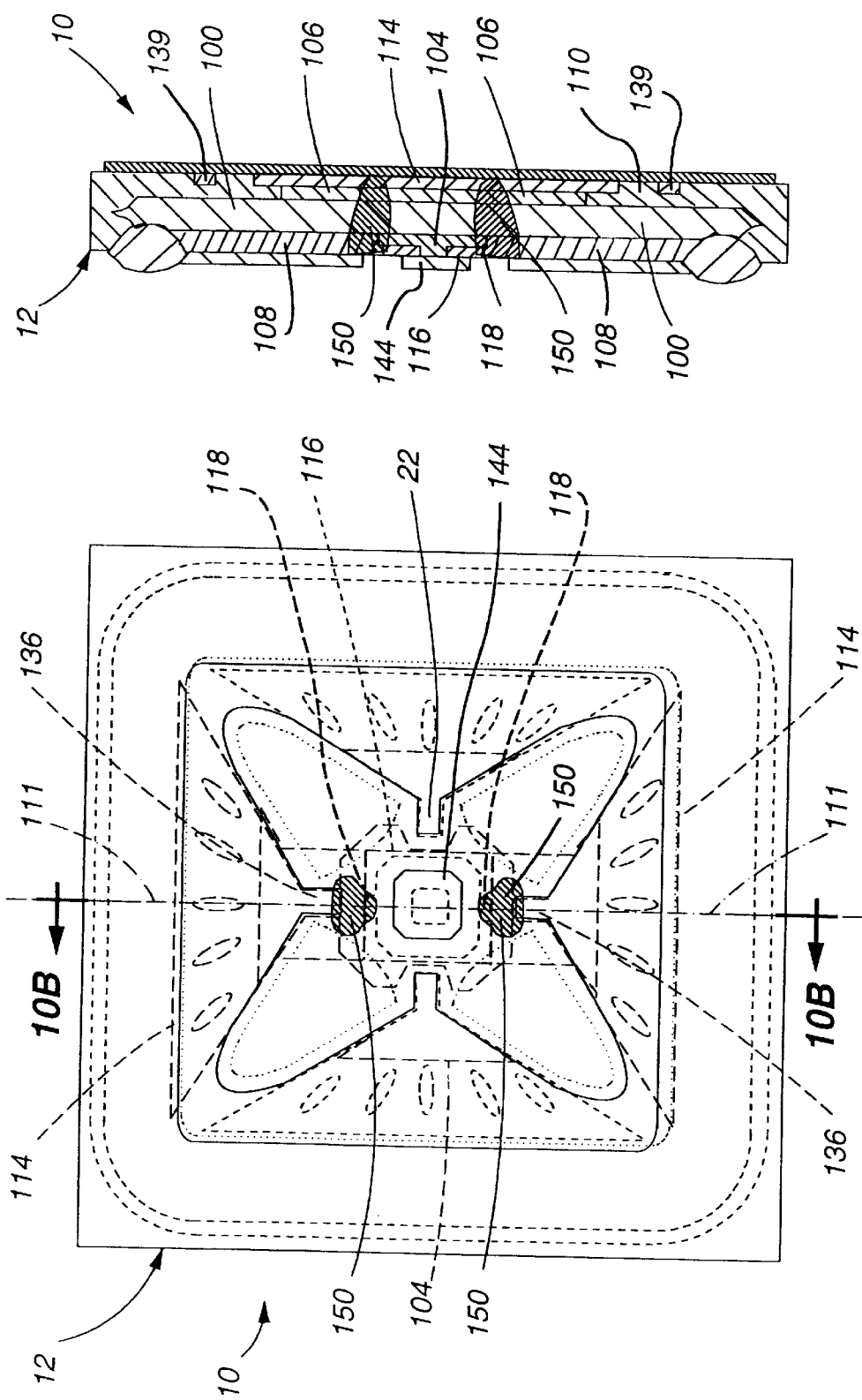

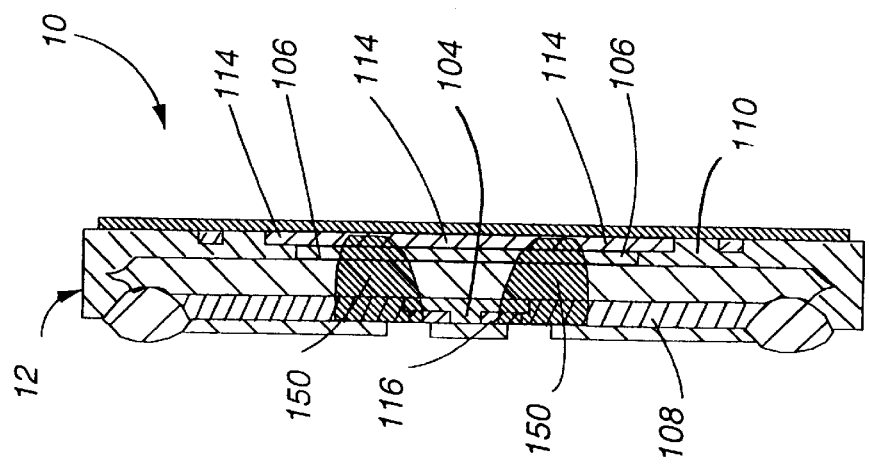
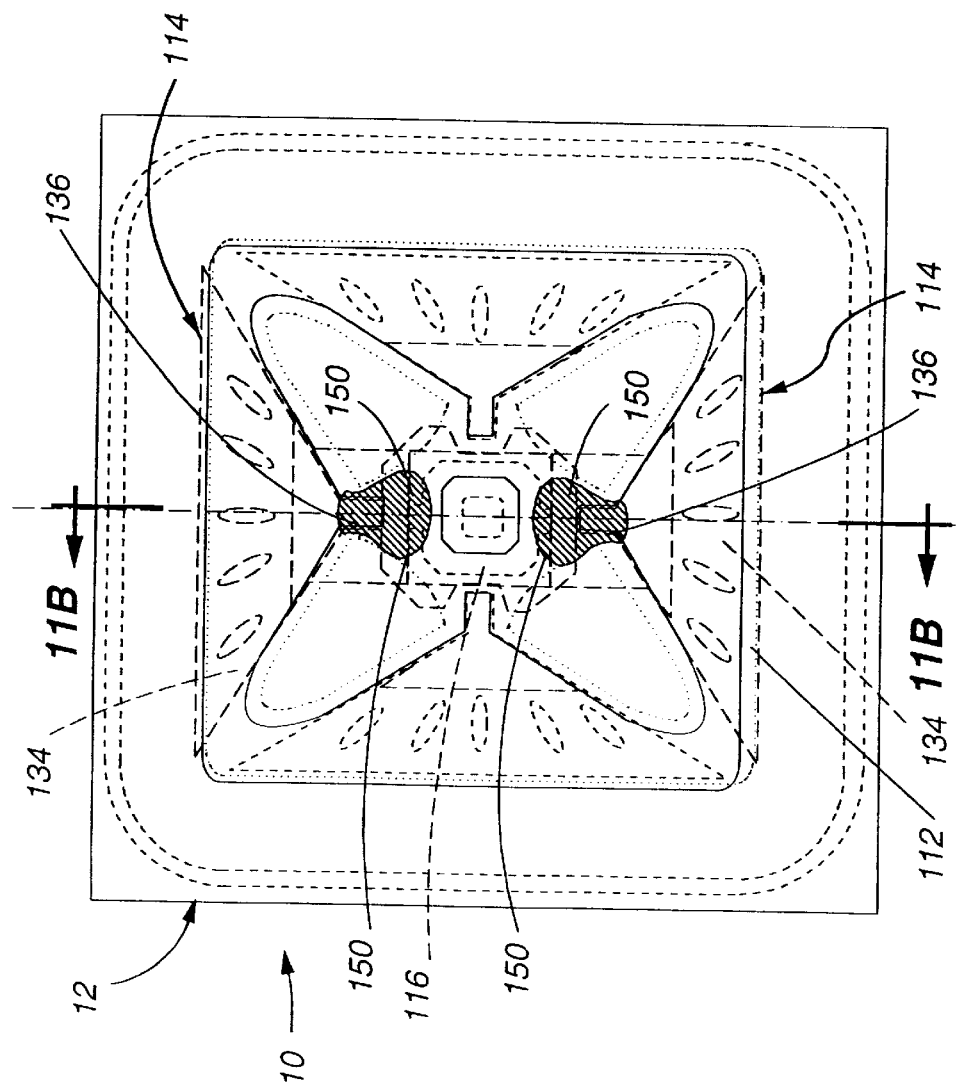
Fig. 11A
Fig. 11B

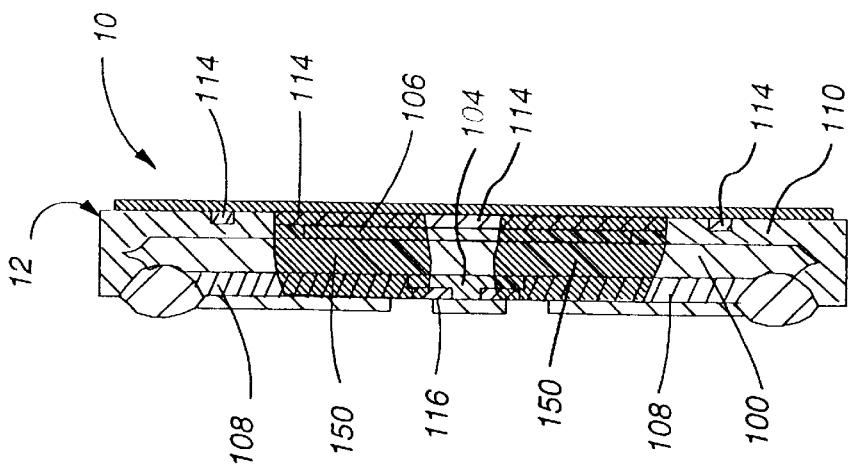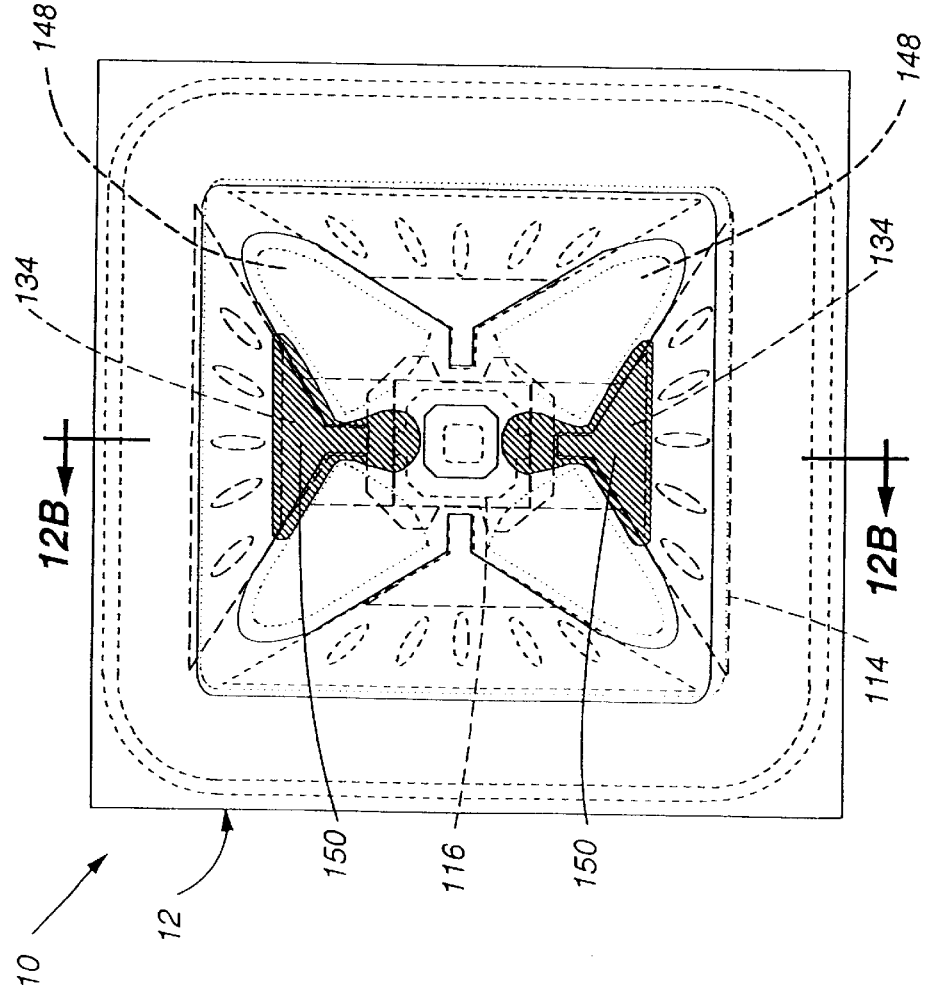

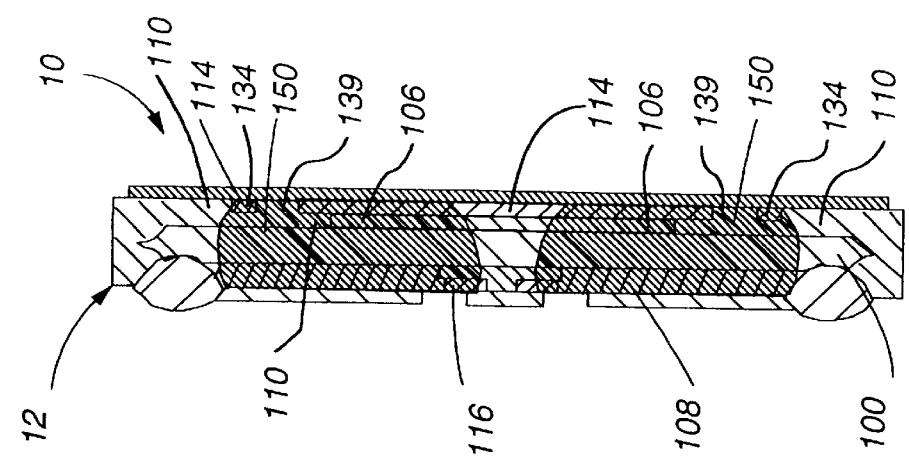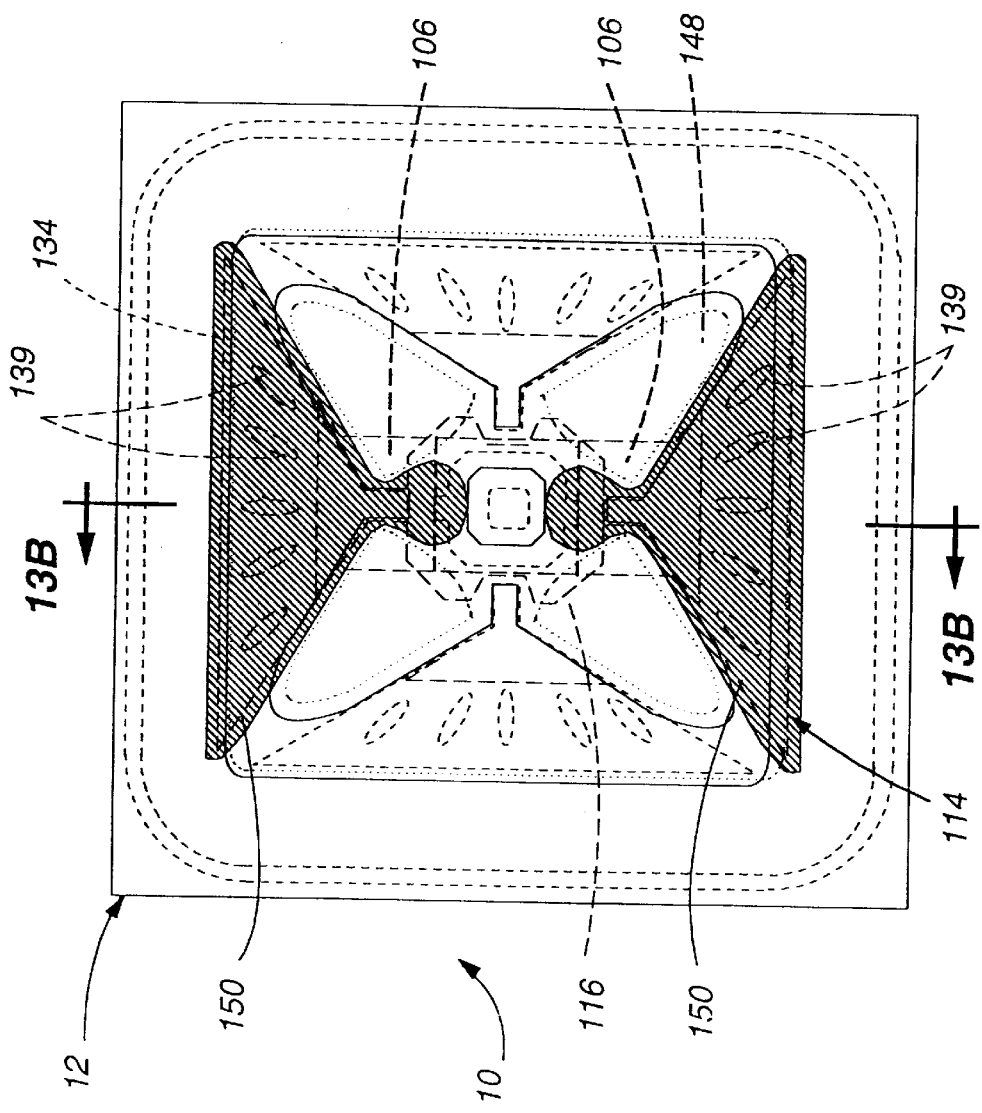

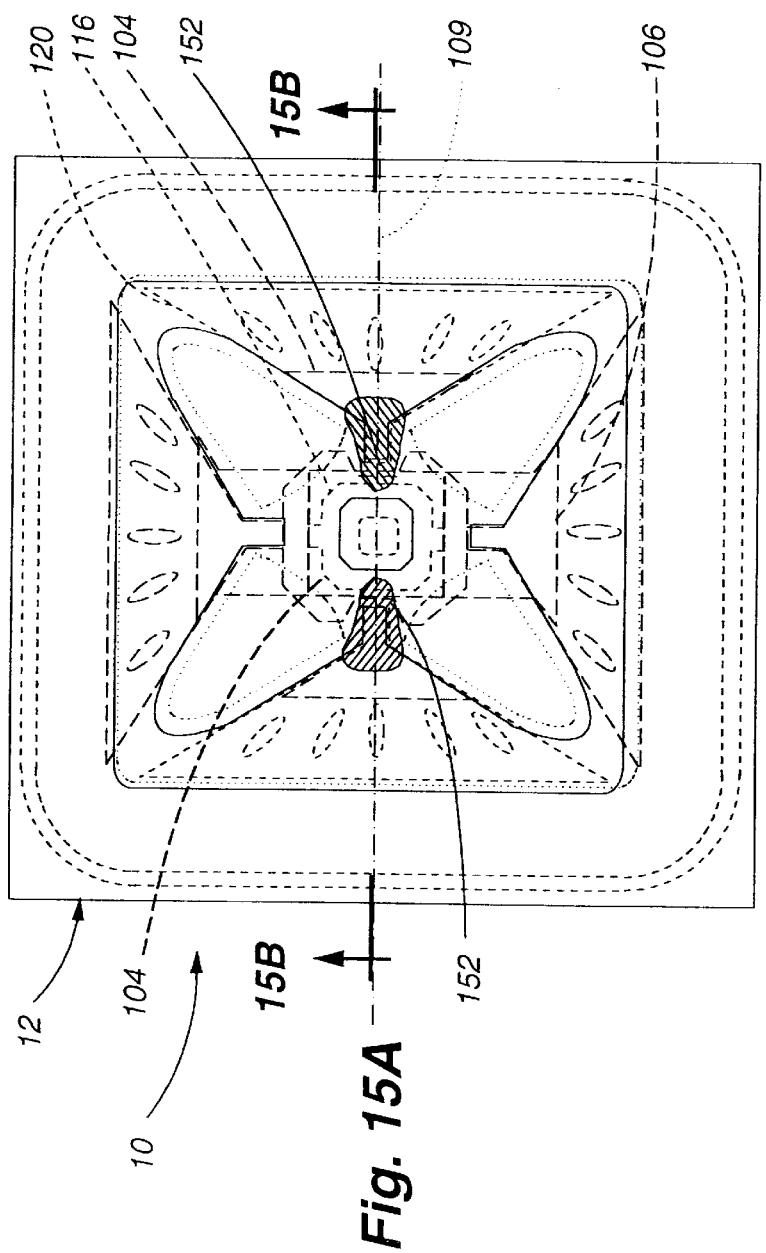
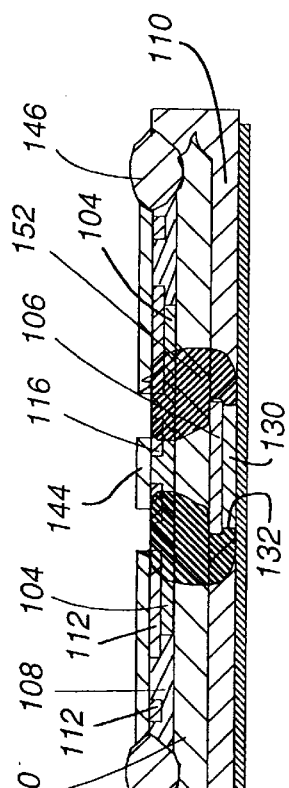
Fig. 15A
Fig. 15B

SMOOTH SWITCHING THYRISTOR

This invention relates to a new and improved semiconductor thyristor which exhibits a smooth transition in conductivity when switching on, thereby significantly reducing radiated and conductive interference signals which typically result from the more instantaneous current transitions resulting from the turn-on switching characteristics of conventional semiconductor thyristors.

CROSS REFERENCE TO RELATED APPLICATIONS

The subject matter disclosed in a U.S. patent application for a High Temperature, High Holding Current Semiconductor Thyristor, Ser. No. 08/257,899, filed Jun. 10, 1994, which is assigned to the assignee hereof, is hereby incorporated in this application by this reference.

BACKGROUND OF THE INVENTION

Many types of electrical and electronic devices generate radiated and conductive interference signals. Radiated inference signals are typically broadcast through space. Conductive interference signals are typically conducted over power supply mains or power conductors. Radiated interference signals, if substantial enough in magnitude, may pose a health hazard. More typically however, conductive interference signals may adversely interfere with the proper operation of other electronic circuits which are located in close proximity to or which are connected to the power supply mains. For these and other reasons, electronic devices are subject to governmental and regulatory restrictions limiting the amount of interference which can be emitted from such products.

One major source of conductive interference is a type of electrical power supply which switches the applied supply voltage on and off to regulate the delivered output power. Switching power supplies are common in many different types of electronic devices and in controllers for dimming or adjusting the intensity of lights. Typical light controllers include silicon controlled rectifiers (SCRs) or triacs, both of which are hereinafter generically referred to as a thyristor. The thyristor is usually mounted in a wall switch box, or is otherwise integrated with the light source itself. An example of a lighting control device which employs a thyristor for controlling the illumination of a light source is described in U.S. Pat. No. 5,030,890, which is assigned to the assignee hereof.

The thyristor generates the interference signals as a result of an essentially instantaneous and virtually discontinuous current transition when switching from an off or nonconductive condition to an on or conductive condition, when a significant voltage exists across the thyristor at the time that the switching occurs. The instantaneous and discontinuous current change is an inherent result of the switching action of the thyristor. The magnitude of the interference signal depends directly upon the magnitude of the current change rate with respect to time (di/dt) and on the inductance of the electrical circuit. In a circuit with a relatively high inductance, a relatively low di/dt will create a significant level of inference. By comparison, a circuit with a relatively low inductance requires a greater di/dt to produce similar interference signals.

In general, the progress in thyristor design over approximately the past three decades has focused on efforts to improve the functional characteristics or parameters of thyristors. For example, thyristors have been improved to obtain faster turn-on characteristics and higher sensitivities to relatively low magnitude trigger currents.

These operational characteristics have contributed to greater di/dt effects. In addition, other desirable thyristor characteristics such as high repetitive peak off-state blocking voltages, low on-state resistances, low holding currents, low Latching currents and high operating temperature ranges, have also contributed to greater di/dt effects.

All known previous attempts to control the interference signals generated by thyristors have involved the addition of auxiliary attenuating circuit elements. The attenuating circuit elements have taken the form of filters which may be as simple as a capacitor connected between the power terminals of the thyristor, or as complex as an elaborate multipole, multi-component, complex filter using both passive and active elements. U.S. Pat. No. 5,264,761 and U.S. patent applications Ser. Nos. 08/027,855 and 08/202,368, all assigned to the assignee hereof, describe examples of such filtering and attenuation devices used with a thyristor. The insertion of an inductance in series with the power mains prevents conductive interference signals from traveling into the power mains. These auxiliary attenuating elements add to the complexity and to the manufacturing expense associated with the products in which the thyristors are employed.

Insofar as is known, there have been no successful attempts to modify the on-switching conductive characteristics of the thyristor itself for the purpose of reducing the instantaneous and discontinuous di/dt current conductivity effects, to thereby inherently reduce the magnitude of the interference signals generated from switching the thyristor.

SUMMARY OF THE INVENTION

A primary aspect of the present invention relates to a semiconductor structure for a thyristor which achieves a smooth current conductivity transition when switching between a nonconductive and a conductive state, thereby reducing the di/dt effect. Another related aspect of the present invention involves a semiconductor thyristor structure which eliminates the more instantaneous and discontinuous on-switching conductivity transitions typical in prior semiconductor thyristors.

In accordance with these features, an improved semiconductor thyristor of the present invention comprises a structure having multiple different semiconductor layers, each having predetermined configurations and regions which cause a plasma of carriers to flow in an expanding volume over a finite period of time to reach a full conduction condition. The finite period of time to reach the full conduction condition is considerably longer than that of a conventional thyristor, and results in smoothing the on-switching current transition conductivity characteristic to inherently reduce the di/dt effect.

In a preferred embodiment of the invention, the spread of the plasma of carriers is controlled by the shape or configuration of regions of the superconductor layers and potential barriers created by diffusion differentials between regions and in regions. In a referred form, the semiconductor thyristor is formed by two silicon controlled rectifier (SCR) structures arranged back-to-back in five distinct layers, with a middle layer common to both SCR structures. The two SCR structures are generally similar in shape and are arranged about a common center point. Each SCR structure includes a layer having two funnel- or triangularly-shaped regions oriented diametrically opposite one another relative to the center point. The center area of the structure provides the location for triggering the flow of plasma of carriers within the thyristor. Once triggered, a small volume of carriers formed near the center point increases in a diametrically spreading geometrical relationship along the funnel-shaped segments. Insulating lobes divide the funnel-shaped segments and aid in confining the spread of the plasma to the funnel-shaped segments. A doping profile gradient in the layer forming the base structures of the transistors in the SCR segments also slows the growth of the plasma. A band gap potential barrier also inhibits the growth of the plasma as it nears its largest expansion. The time-related growth pattern of plasma of carriers creates a smooth turn-on transition in conductivity.

A more complete appreciation of the present invention and its scope can be obtained from the accompanying drawings which are briefly described below, from the following detailed description of a presented preferred embodiment of the invention, and from the appended claims.

BRIEF DESCRIPTION OF THE DRAWINGS

FIG. 2 is a waveform diagram of a trigger signal of the thyristor shown in FIG. 1.

FIG. 3 is a graph of the on-switching conductive characteristic of the thyristor shown in FIG. 1.

FIG. 4 is a top plan view of a semiconductor structure which forms one example of the thyristor shown in FIG. 1.

FIG. 5 is a horizontal cross section view taken substantially in the plane of line 5—5 of FIG. 4.

FIG. 6 is a vertical cross section view taken substantially in the plane of line 6—6 of FIG. 4.

FIG. 7A is an exploded perspective view of the major regions and layers of the semiconductor thyristor structure shown in FIGS. 4–6.

FIG. 7B is an enlarged perspective view of a portion of FIG. 7A.

FIGS. 10A and 10B are views of FIGS. 4 and 6, respectively, illustrating a plasma of carriers at a first point in time after the trigger signal (FIG. 2) has been applied when a voltage of one polarity is applied across the thyristor.

FIGS. 11A and 11B are views similar to FIGS. 10A and 10B illustrating the spread of the plasma at a second advanced point in time more advanced after that point in time illustrated in FIGS. 10A and 10B.

FIGS. 12A and 12B are views similar to FIGS. 10A and 10B illustrating the spread of the plasma at a third point in time more advanced after that point in time illustrated in FIGS. 11A and 11B.

FIGS. 13A and 13B are views similar to FIGS. 10A and 10B illustrating the spread of the plasma at a fourth point in time more advanced after that point in time illustrated in FIGS. 12A and 12B.

FIGS. 15A and 15B are views similar to FIGS. 14A and 14B illustrating the spread of the plasma at a second point in time more advanced after that point in time illustrated in FIGS. 14A and 14B.

DETAILED DESCRIPTION

Figure 1:
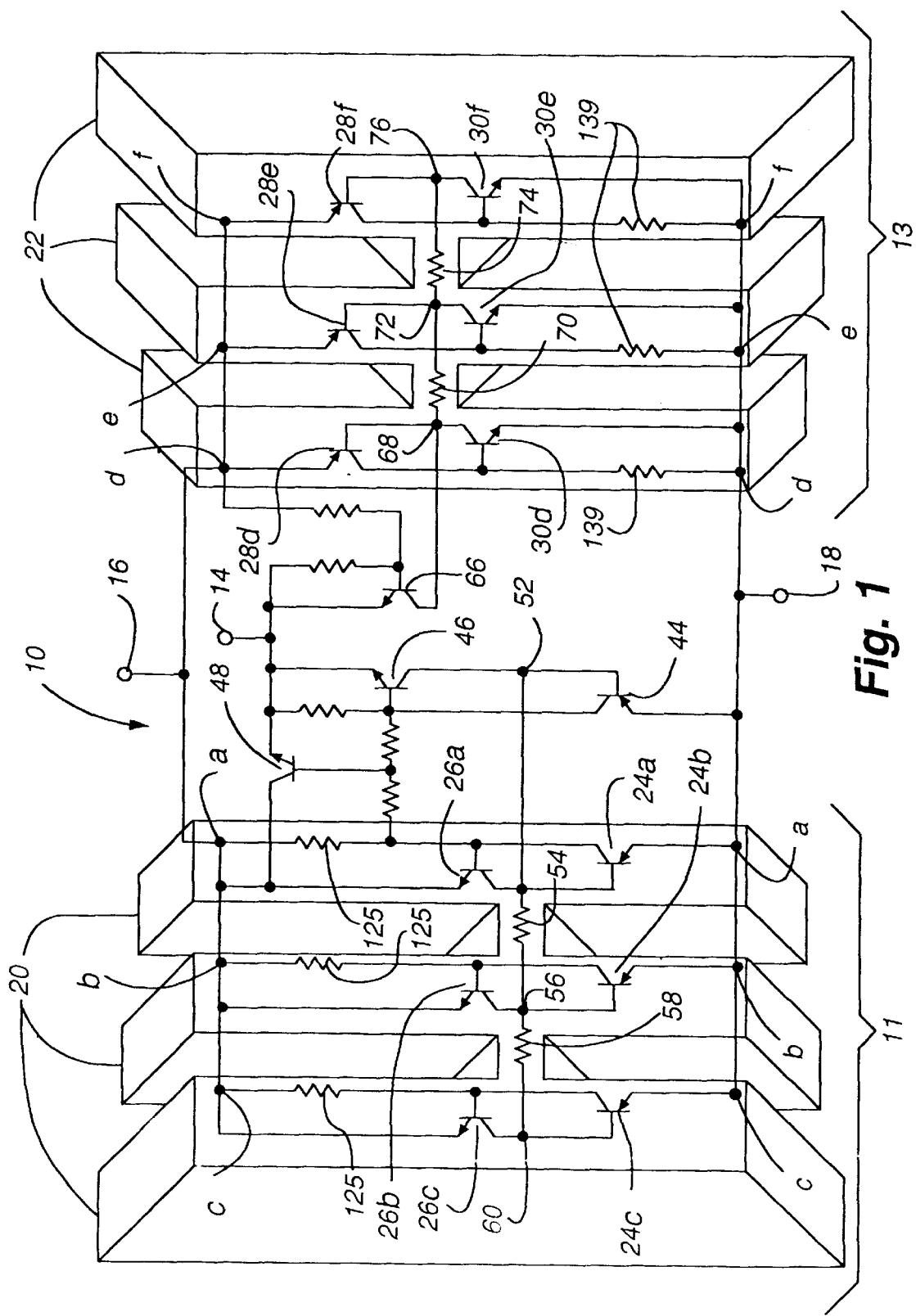
FIG. 1 is an electrical circuit schematic diagram, which also models a physical size characteristic, of a thyristor according to the present invention.

An improved thyristor 10, which exhibits relatively smooth on-switching conductivity transition characteristics according to the present invention, is shown in a circuit schematic and size illustrating form in FIG. 1, and as a semiconductor structure 12 in FIGS. 4–7B.

Referring first to its circuit schematic form shown in FIG. 1, the thyristor 10 includes a gate terminal 14 to which a triggering signal is applied. In response to the triggering signal applied to the gate terminal 14, the thyristor conducts current between two main power terminals 16 and 18. The thyristor 10 selectively conducts current in both directions between the power terminals 16 and 18, according to the relative polarity of the voltage applied across the power terminals 16 and 18. The capability to conduct current in both directions between the power terminals 16 and 18 occurs because the thyristor is formed in the well known manner to include two SCR portions 11 and 13.

A typical SCR has two transistors with complementary conductivity characteristics (NPN and PNP). A trigger signal, applied to a node which connects the two transistors, triggers the complementary transistors into saturated conductivity, and causes the current to flow from one power terminal to the other. The direction of the current conduction depends on the polarity of the transistors which form the SCR. Connecting two such SCR portions of opposite polarity to the power terminals will allow current to be conducted in opposite directions. Greater current conductivity is achieved by increasing the sizes of the transistors in the SCR portions which, in a structural sense, may be thought of as effectively compiling a multiplicity of SCR segments.

Each SCR portion 11 and 13 is formed by a plurality of smaller SCR segments. The SCR portion 11 is formed by a plurality of SCR segments 20 and the SCR portion 13 is formed by a number of SCR segments 22. Each SCR segment 20 includes a PNP transistor 24 and a NPN transistor 26. Each SCR segment 22 includes a PNP transistor 28 and a NPN transistor 30.

In each SCR segment 20, an emitter of the PNP transistor 24 is connected to the power terminal 18, and an emitter of the NPN transistor 26 is connected to the power terminal 16. A base of the transistor 26 is connected to the collector of transistor 24, and the collector of transistor 26 is connected to the base of transistor 24. Connected in this manner, current is conducted from the power terminal 18 to the power terminal 16 when the voltage applied to terminal 18 is relatively greater than the voltage applied to terminal 16.

In each SCR segment 22, an emitter of the NPN transistor 30 is connected to the power terminal 18, and an emitter of the PNP transistor 28 is connected to the power terminal 16. A base of the transistor 28 is connected to the collector of transistor 30, and the collector of the transistor 28 is connected to the base of transistor 30. Connected in this manner, current is conducted from the power terminal 16 to the power terminal 18 when the voltage applied to terminal 16 is relatively greater than the voltage applied to terminal 18.

From the standpoint of semiconductor structure, the thyristor 10 can be considered as a plurality of the SCR segments 20 and 22 connected between the power terminals 16 and 18 in an expanding physical relationship, as is illustrated by an expanding structural background associated with each SCR segment 20 and 22 shown in FIG. 1. The size of each SCR segment increases as each SCR segment is more laterally positioned from the center of the structure. Increasingly larger SCR segments 20 of the SCR portion 11 extend in sequence between locations "a," "b" and "c" of the power terminals 16 and 18. Increasingly larger SCR segments 22 of the SCR portion 13 extend between locations "d," "e" and "f" of the power terminals 16 and 18. In actuality, as will be appreciated from the following description of the thyristor structure 12, the discrete SCR segments 20 and 22 shown in FIG. 1 are not formed in the thyristor structure 12. Instead, the regions of the structure 12 are as though the increasingly larger SCR segments 20 and 22 exist within the thyristor 10. These increasingly larger SCR segments are achieved by the physical configuration of the regions of the semiconductor structure 12.

As shown in FIG. 1, transistors 44, 46, and 48 form a turn-on device for the SCR segments 20. The PNP transistor 44 and the NPN transistor 46 are connected as a small gate SCR segment similar to the SCR segments 20. The transistor 48 is laterally connected between the gate terminal 14 and the power terminal 16. Upon application of a negative voltage trigger signal to the gate terminal 14, the transistor 48 draws current from the power terminal 16.

The SCR segments 20 are turned on by a trigger signal when the power terminal 16 is negative with respect to the power terminal 18, as would occur if power terminal 16 was grounded and power terminal 18 was positive, or if power terminal 18 was grounded and power terminal 16 was negative. The negative trigger signal 50 at the gate terminal 14 causes base current to flow in the transistor 46 due to the positive doping of the base region of the transistor 44 (as discussed below in conjunction with FIGS. 4–7B). The base current flow in the transistor 46 causes collector current to flow in the transistor 44. The collector current from transistor 46 causes more base current to flow in the transistor 44, thereby causing a positive current feedback or regeneration amplifying effect in the transistors 44 and 46 until both transistors 44 and 46 become completely saturated and fully conductive.

As the transistors 44 and 46 become conductive, the voltage at a node 52 at the junction of the base of transistor 44 and the collector of transistor 46 moves toward a potential which is close to the negative voltage of the trigger signal applied to the gate terminal 14. Node 52 is connected to the collector of the NPN transistor 26a and the base of the PNP transistor 24a of the SCR segment 20 which is connected at the locations "a." The SCR segment at the locations "a" becomes conductive because the lower voltage at node 52 draws base current from the PNP transistor 24a and the resulting collector current from the PNP transistor 24a drives more base current to the NPN transistor 26a. The current magnitude is amplified because of the positive current feedback or regeneration amplifying effect until the PNP and NPN transistors 24a and 26a of the SCR segment 20 at the locations "a" become completely saturated and fully conductive.

The conductive effect of the gate SCR transistors 44 and 46 and the PNP and NPN transistors 24a and 26a is to establish a flow or "plasma" of carriers, as is described in greater detail below. This plasma of carriers spreads to the left (as shown in FIG. 1) through a resistance 54 to a node 56 of the SCR segment 20 connected at locations "b." The SCR segment 20 connected at the locations "b" becomes conductive, because the potential at the node 56 approaches the potential at node 52. As the SCR segment 20 at the locations "b" becomes conductive, the plasma of carriers spreads through a resistance 58 to a node 60 of the SCR segment 20 at the locations "c." The SCR segment at the locations "c" becomes conductive in the same manner as the previous SCR segments have become conductive.

All of the SCR segments 20 do not turn on or achieve saturated current conductivity instantaneously. Instead, a progressive turn-on effect occurs as the plasma of carriers spreads and expands from node 52 through the resistance 54 to the node 56, and from the node 56 through the resistance 58 to the node 60. As is discussed below in conjunction with FIGS. 4–7B, the resistances 54 and 58 involve a diffusion gradient doping of a layer of the semiconductor structure 12 which forms the base structures of transistors 26a, 26b and 26c. The diffusion gradient establishes a potential barrier to resist the spread of the plasma of carriers. The potential barrier must, in effect, be overcome by the increasing size of the plasma as it spreads from the nodes 52, 54 and 56. Furthermore, doping or diffusion differences between the adjoining regions establish a band gap potential barrier which also retards the expansion of the plasma. The potential barrier imposes a slight time delay in the progress of the plasma, and thereby slightly delays the turn-on and saturated conductivity times of each of the SCR segments 20 starting at the locations "a," progressing to the locations "b" and then to the locations "c."

Furthermore, the size of the SCR segments 20 increases progressively from the locations "a" to the locations "c." The increased size of each SCR segment is schematically illustrated in FIG. 1 by the size of the background blocks associated with each segment 20. The background block behind the SCR segment 20 at locations "a" is much smaller than the background block shown at locations "c." In reality a single SCR portion 11 exists whose size effectively increases in the direction in which the plasma spreads, as is shown in FIGS. 4–7B. The increasing size of the transistors of each segment 20 increases the amount of time it takes for each segment to become biased into conductive saturation. The larger transistor size requires more carriers (a larger sized plasma) to achieve the conductive saturation, and more time is required to generate the carriers The potential gradient of the base structures of the transistors 26a, 26b and 26c, and the progressively increasing size of the SCR segments, slow the time required for the thyristor 10 to become fully conductive between the power terminals 16 and 18. The transition in conductivity occurs more gradually than if a single high capacity SCR segment was turned on instantaneously. This effect is illustrated in FIG. 3.

Curve 62 shown in FIG. 3 illustrates the voltage between the thyristor power terminals due to the thyristor characteristics. The curve 62 is shown in a direct time relation to the negative voltage trigger signal 50 illustrated in FIG. 2, for comparison purposes. The trigger signal 50 is applied at time $T_0$ where the applied voltage between the terminals 16 and 18 (FIG. 1) is at a relatively significant level. At time $T_1$, the gate SCR transistors 44 and 46 start to conduct a small amount of current. The relatively small size of the gate SCR transistors accounts for the small amount of current. The current conduction causes the voltage level of the curve 62 to decrease slightly at time $T_1$ compared to its greater level at time $T_0$. At time $T_2$ the plasma of carriers has interacted with SCR segment 20 connected at the locations "a" (FIG. 1). As the SCR segment 20 at locations "a" commences to conduct, more current is drawn through the thyristor, causing the voltage of curve 62 to drop even more. At time $T_3$ the plasma of carriers has progressed through the resistance 54 to the node 56, and the SCR segment 20 connected at the locations "b" has become conductive. The increased size of the SCR segment causes even more current to be drawn through the thyristor, dropping the voltage of curve 62 even more. Finally the plasma of carriers progresses through the last resistance 58 and encompasses the node 60 at time $T_6$. The relatively larger size of the SCR segment 20 at the locations "c" conducts even more current and results in the continued decrease of voltage of the curve 62. Thereafter, the current flow through the device is determined primarily as a function of the voltage applied across the power terminals and the impedance connected to the thyristor.

In contrast to curve 62, curve 64 shown in FIG. 3 illustrates the typical turn-on conductivity characteristic of a conventional thyristor. At time $T_5$ the conductivity of the prior art thyristor changes almost instantaneously and virtually discontinuously from a non-conductive state to a fully conductive state as evidenced by the relatively steep slope of the curve 64 at time $T_5$. As a result, a relatively sharp corner 63 exists on the curve 64. The relatively sharp corner 63 is responsible, to a significant extent, for the interference signals. Furthermore, the relatively steep, almost vertical slope of the curve 64 at time $T_5$ also contributes to the generation of interference signals, because the steep slope simulates a step function which inherently contains high frequency components.

The relatively gentle and smooth transition of the curve 62 contrasts to the instantaneous and discontinuous nature of the curve 64. The smooth transition of curve 62 avoids generating interference signals of large magnitudes. The more gentle slope of the curve 62 at the time $T_5$ does not carry with it the inherent high frequency components as does the step function-like vertical component of the curve 64. The slowed progression of the plasma of carriers, due to the doped gradient of the base structures of transistors 26a, 26b and 26c, the slightly longer switching times of the larger SCR segments, and the multiplicative current effect of progressively larger SCR segments inherently avoids or significantly reduces the amount of interference signals generated.

A similar effect occurs when the SCR segments 22 are turned on, as can be understood from FIG. 1. The SCR segments 22 are turned on when the voltage at the power terminal 16 is positive with respect to the power terminal 18, as would occur when the power terminal 16 is grounded and the terminal 18 is connected to a negative potential source. The application of the negative voltage trigger signal 50 (FIG. 2) to the gate terminal 14 causes current to flow in a transistor 66. The collector of transistor 66 is connected to a node 68 of the SCR segment 22 connected at the locations "d." The negative voltage trigger signal causes the transistor 66 to decrease the voltage at a node 68. The decreased voltage at node 68 draws base current from the PNP transistor 28d, causing it to enter a conductive state. The collector current from the PNP transistor 28d biases the NPN transistor 30d of the SCR segment 22 into conduction. A positive feedback current regenerative effect occurs, which causes the PNP transistor 28d and the NPN transistor 30d to become fully conductively saturated.

The plasma of carriers spreads from the node 68 through a resistance 70 to a node 72 of the SCR segment 22 connected at the locations "e." The larger SCR segment 22 at the locations "e" takes slightly more time to become fully conductive. The plasma continues to spread through the resistances 74 to the node 76 and through the lateral doping gradient of the base structure of the SCR segment 22 connected at the locations "f." The larger-sized SCR segment 22 at the locations "f" thereafter becomes conductive. As is discussed below in conjunction with FIGS. 4–7B, the resistances 70 and 74 involve a diffusion gradient doping of a layer of the semiconductor structure 12 which forms the base structures of transistors 28d, 28e and 28f. The diffusion gradient establishes a potential barrier to resist the spread of the plasma of carriers. The potential barrier must, in effect, be overcome by the increasing size of the plasma as it spreads from the nodes 68, 70 and 72. Furthermore, doping or diffusion differences between the adjoining regions establish a band gap potential barrier which also retards the expansion of the plasma. The potential barrier imposes a slight time delay in the progress of the plasma, and thereby slightly delays the turn-on and saturated conductivity times of each of the SCR segments 22 starting at the locations "d," progressing to the locations "e" and then to the locations "f." By this progressive and multiplicative current effect, the same smooth turn-on conductive characteristics represented by the curve 62 are attained by the conduction of the SCR portion 13.

Details of a presently preferred thyristor semiconductor structure 12, which are responsible for the desirable improvements in the turn-on characteristics of the thyristor 10, are shown in FIGS. 4–7B. The structure 12 is formed starting with a lightly doped N– substrate. All of the substrate except a center N– region 100 is transformed into regions of other characteristics. A wrap-around isolation ring 102 is thereafter created by simultaneously diffusing P+ material into the N– material from the top and bottom. The top and bottom P+ materials meet around the outside of the N– material, thereby surrounding the N– material with the P+ isolation ring 102.

After forming the wrap-around isolation ring 102, a P++ top region 104, a P++ bottom region 106, a P+ top region 108, and a P+ bottom region 110 are diffused into the structure. The P++ top and P++ bottom regions 104 and 106 are heavily doped regions having configurations which resemble the shape of the alphabetical letter "I".

The I shaped P++ regions 104 and 106 are oriented generally perpendicular to each other (FIG. 4) and are centered and symmetrical about a center point 107 of the structure 12. The I shaped regions are therefore rotated in parallel planes by about 90° with respect to each other. The symmetry is shown by a horizontal reference line 109 running longitudinally to the region 104 and bisecting a vertical reference line 111 which runs longitudinally to the region 106 and at a right angle to the reference line 109 at the center point 107 (FIG. 4). The vertical section view shown in FIG. 6 is taken along the vertical reference line 111 and the horizontal section view shown in FIG. 5 is taken along the horizontal reference line 109. The center point 107 and the reference lines 109 and 111 are employed primarily as references for describing the lay-out of the regions of the structure 12. The longer longitudinal dimension of the top P++ I shaped region 104 extends parallel to the horizontal reference line 109. The longer longitudinal dimension of the bottom P++ I shaped region 106 extends parallel to the vertical reference line 111.

The top and bottom P++ regions 104 and 106, respectively, are doped with P++ material in a gradient diffusion. A gradient occurs because the concentration of P++ material at the innermost interior surfaces of the I-shaped regions 104 and 106 (surfaces adjoining the N– region 100 as shown in FIGS. 5 and 6) is less concentrated than the P++ material at the opposite exterior surfaces of the regions 104 and 106 which are the farthest removed from the N– region 100. This depth-wise diffusion gradient doping effect (which appears in a vertical dimension as shown in FIG. 5 and in horizontal dimension in FIG. 6) creates a potential barrier to resist the spread of the plasma of carriers. The manner in which the diffusion gradients of the P++ regions 104 and 106 achieve this effect is explained in greater detail below.

Next, a top N+ region 112 and a bottom N+ region 114 are formed. The shapes of the N+ regions 112 and 114 are very important in achieving the progressively increasing size of the SCR segments 20 and 22 (FIG. 1). This shape characteristic contributes significantly to the progressive turn-on conductivity characteristics of the thyristor 10.

Figure 8:
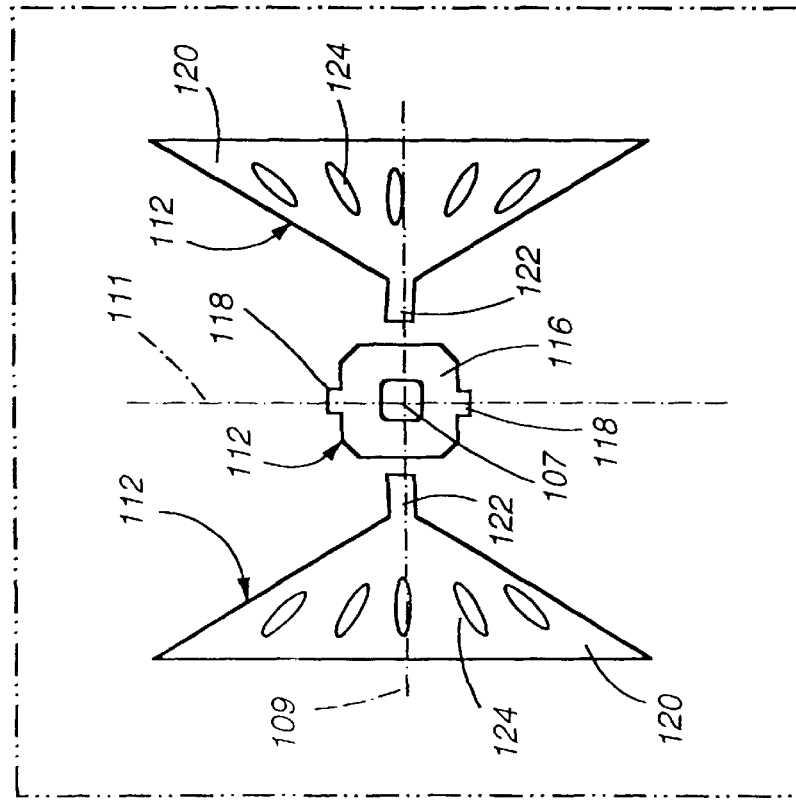
FIG. 8 is a top plan view of a top N+ region of the semiconductor thyristor structure shown in FIGS. 4–7B.

Details concerning the top N+ region 112 are more apparent from FIG. 8. The orientation of the top N+ region is generally along the horizontal reference line 109. The top N+ region 112 includes a center, generally ring-like structure 116. Two tabs 118 extend in the vertical dimension (as shown) from the center ring structure 116. The center of the ring structure 116 is open and is filled with the P++ material of the top P++ region 104. Horizontally (as shown) on each side of the ring structure 116 are two funnel- or triangularly-shaped structures 120. Each triangle structure 120 is positioned symmetrically about the horizontal reference line 109. Each triangle structure 120 includes a small rectangular neck portion 122 which projects inwardly toward the ring structure 116. The areas between the neck portions 122 and the ring structure 116 and surrounding the triangle structures 120 are formed from the P++ material of the region 104 and P+ material 108. Elliptical openings 124 are formed in each triangle portion 120. The longer axis of each of the elliptical openings 124 is pointed toward the location of the neck portion 122 of the triangle portion 120. The P+ material within the openings 124 constitute cathode resistors 125 (FIG. 1) formed in the SCR segments 20. The cathode resistors 125 provide high temperature stability for the SCR segments 20 (FIG. 1).

Figure 9:
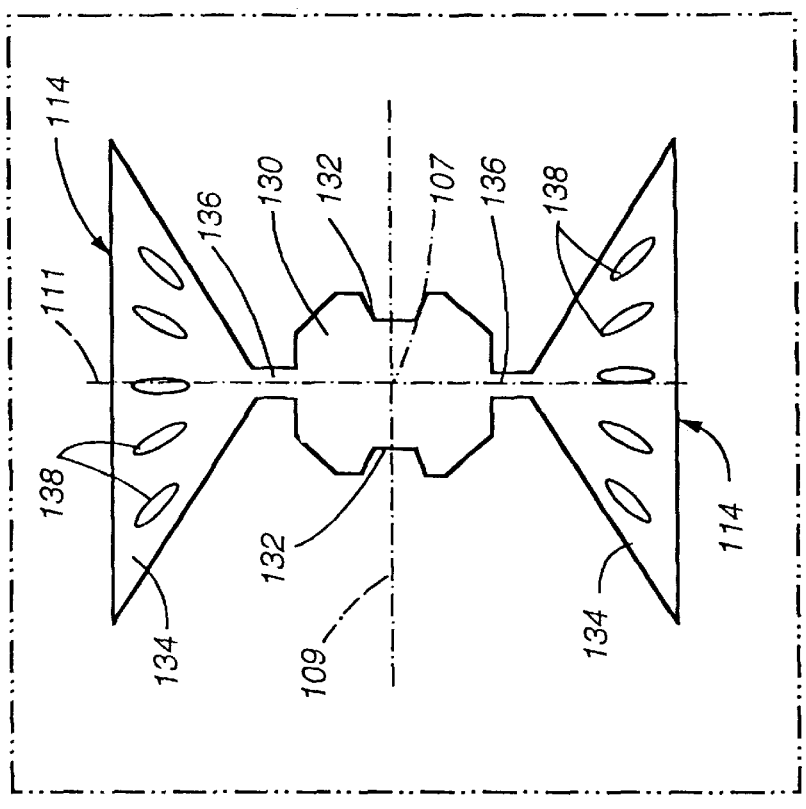
FIG. 9 is a top plan view of a bottom N+ region of the semiconductor thyristor structure shown in FIGS. 4–7A.

Details concerning the bottom N+ region 114 are shown in FIG. 9. The bottom N+ region 114 has some overall geometrical similarity to the top N+ region 112, except that the bottom N+ region extends generally along the vertical reference line 111. A generally octagonally shaped portion 130 of N+ material is formed about the center point 107 at the bottom of the structure 12. The octagonal portion 130 has two indentions 132 extending horizontally in from each horizontal side. Funnel- or triangularly shaped portions 134 extend vertically from the octagonal center portion 130 and are joined to the center portion 130 by rectangular bridge portions 136. The bottom P+ material 110 and the P++ bottom material 106 surround the bottom N+ region 114. Elliptical openings 138 are formed in the triangular portions 134, and each elliptical opening 138 has its longitudinal axis pointed toward the rectangular bridge portions 136. The elliptical openings 138 are occupied by P+ material 110 forming cathode resistances 139 (FIG. 1) which provide high temperature stability for the SCR segments 22 (FIG. 1).

The top P+ region 108 and the bottom P+ region 110 are defined by the formation of the top P++ and bottom P++ I shaped regions 104 and 106, respectively, and the top and bottom N+ regions 112 and 114. The top and bottom P+ regions 108 and 110 generally occupy the space not occupied by the I-shaped regions 104 and 106 or by the N+ regions 112 and 114 in the area adjacent to the N– region 100. The bottom P+ region 110 merges into the wrap-around isolation ring 102.

An insulating moat 146 is formed by etching the silicon from the top surface into the center N– region 100 to separate the top P+ region 108 from the wrap-around isolation ring 102, as shown in FIGS. 4–7A. This moat 146 (FIGS. 4–7A) is filled with an insulated photoglass material that effectively isolates the top P++, P+, and N+ regions 104, 108, and 112 from the bottom regions.

Also formed concurrently with the moat 146 are insulating lobes 148 which radiate outwardly from the center point 107 (FIGS. 4 and 7A). The lobes 148 generally separate the triangular portions 120 of the top N+ region 112, the P++ material 104 and the P+ material 108 underneath the N+ region 112, from the adjacent P+ material 108 which is not covered by the top N+ material 112. The lobes 148 confine the flow of plasma to the space defined by the triangular portions 120 of the top N+ region 112. The lobes 148 are formed by using the other regions of the layers against which the insulating photoglass material is deposited. Alternatively, the lobes 148 can be defined by isolation from reactive ion milling to establish the desired insulation barriers to confine the flow of plasma.

Finally, a region 140 of top metal and a region 142 of bottom metal are formed on the opposite top and bottom sides of the structure 12 (FIGS. 4–7A). The bottom metal 142 becomes the power terminal 18, and the top metal 140 becomes the other power terminal 16. A center portion 144 of the top metal 140 becomes the gate terminal 14. The top metal gate terminal center portion 144 contacts the ring structure 116 of the N+ top region 112 and the gate region in the center of the center ring 116 where the P++ material 104 exists as shown in FIGS. 5 and 6.

The shapes of the top and bottom N+ regions 112 and 114, the diffusion gradient within the top and bottom P++ regions 104 and 106, and the doping or diffusion difference band gap potential barrier between the regions 104 and 108 and the regions 106 and 110, are the primary features of the thyristor 10 that create the smooth transition turn-on conductivity characteristics. This is better understood by reference to FIGS. 10A–17B, taken in conjunction with FIG. 1 for reference purposes.

Consider first, with reference to FIG. 1, the electrical conductivity circumstance illustrated where terminal 16 is positive with respect to terminal 18, such as when terminal 18 is grounded and terminal 16 is held at a positive voltage. In this condition, the SCR segments 22 will become conductive. The SCR segments 20 are reverse biased and are therefore not conductive.

FIGS. 10A and 10B illustrate this polarity circumstance with a negative trigger signal applied to the gate terminal 144 at the ring structure 116. A cloud or plasma 150 of carriers initiates from the tabs 118 of the ring structure 116 around the edges of the top P++ region 104, and flows through the middle N– region 100 and eventually, directly into the bottom P++ region 106 and to the bottom N+ region 114. The flow of carriers starts at a location near the vertical reference line 111 in a small, localized volume. As the plasma 150 penetrates the region 106, it encounters an increasingly greater potential barrier from the increasing doping gradient of P++ material in the region 106. The increasing gradient of P++ material impedes the recombination times of the carriers, thereby slowing the progress of the plasma as it spreads. The plasma progresses through the bottom P++ region 106 and interacts initially with the rectangular bridge portions 136 of the bottom N+ material 114. The relatively small tabs 118 of the ring structure 116, the relatively small bridge portions 136 of the bottom region 114 and the N− region 100, create the relatively small SCR gate transistor 66 (FIG. 1). A relatively small amount of current is conducted by the gate SCR transistor 66 and the voltage at node 68 drops (FIG. 1). The SCR segment 22 at the locations "d" starts to conduct current between the terminals 16 and 18, such as that which might exist at time $T_1$, as shown in FIGS. 2 and 3. This initial current flow is represented by the plasma 150 shown in FIGS. 10A and 10B.

The current conducted through the SCR segment 22 at the locations "d" causes the voltage at node 68 to approach the level of the trigger signal at the gate 14 (FIG. 1). The decreasing voltage at node 68 biases the SCR segment 22 at the locations "d" further on and causes the plasma carrier cloud 150 to grow in size as shown in FIGS. 11A and 11B. In order for the plasma 150 to grow, it must spread in a lateral sense (vertically as shown in FIG. 11A and 11B) to encompass more of the area of the P++ material of the bottom region 106 and to encompass the bridge portions 136 of the bottom N+ region 114. The diffusion gradient potential barrier of the region 106 inhibits the growth of the plasma 150, thereby slightly delaying the onset of full conductivity of the SCR segment 22 connected at the locations "d" (FIG. 1). Furthermore, the increased size of the SCR segment requires more plasma to achieve saturated conduction, and added time is required to generate the carriers. The complete conductivity of the SCR segment 22 at the locations "d" increases the current conducted between the terminal 16 and 18, so a conductivity condition such as that represented at time $T_2$ as shown in FIGS. 2 and 3 exists, for example. As the plasma 150 grows, the orientation of the bottom P++ region 106 retards its growth, because the orientation of the bottom P++ region 106 expands along the path of expansion of the spreading plasma as is shown in FIGS. 11A and 11B.

As the SCR segment 22 at the locations "d" becomes fully conductive, the plasma 150 continues to spread as shown in FIGS. 12A and. 12B. The plasma expands through more area of the bottom P++ region 106, and the depth-wise diffusion gradient within the bottom P++ region 106 inhibits the spread of the plasma. The plasma 150 grows to encompass the inner portion of the triangle portions 134 of the bottom N+ material of the region 114. The increased area of the triangular portions 134 of the top N+ region 114 creates the SCR segment 22 at the locations "e" (FIG. 1) which has larger transistors, and more current is required to make these larger transistors achieve conductive saturation. The increased current flow is generally represented by the situation shown at time $T_3$ in FIGS. 2 and 3. The lobes 148 of insulating material confine the spread of plasma 150 from the center portion 130 of the bottom N+ region 114 to a region which generally is coincident with the triangle portion 134 of the bottom N+ material of region 114.

The increased current causes the plasma 150 to become larger as is shown in FIGS. 13A and 13B. The spreading plasma encounters the inhibiting depth-wise diffusion gradient of the bottom P++ region 106 which slows its expansion. In addition however, as the plasma 150 spreads beyond the longitudinal end points of the I shaped bottom P++ region 106, a band gap potential barrier created by the lateral differences in diffusion of the P++ material of the region 106 and the P+ material of the adjoining region 110, represented by the base of transistor 30e at locations "e" (FIG. 1), further inhibits the spread of the plasma. The lateral diffusion gradient band gap barrier created by the differences in the P+ and P++ inhibit the growth of the plasma until the band gap potential is overcome. Once the band gap potential is overcome, the plasma spreads into the outer larger portions of the triangle portion 134 of N+ bottom region 114. The larger portion of the triangular shaped region 120 encountered by the plasma 150 in effect constitutes a larger SCR segment 22 at the locations "f" (FIG. 1).

The size of the larger SCR segment at the locations "f" requires the plasma to build to an even greater level before conductive saturation is achieved. A lateral sheet resistance in the P+ material of the region 106 just below its interface with the N+ material of the triangular portion 134 of the region 114 establishes a lateral resistance between the projections of the P+ material into the elliptical openings 138. This interface lateral resistance is one of the components of the cathode resistor 139. The vertical resistance of the P+ material projecting into the elliptical openings 138 creates another component of the cathode resistor 139. Both the lateral and the vertical resistance components are combined in the single resistor 139 shown schematically in FIG. 1, as is typically understood. The cathode resistance 139 diverts some of the spreading plasma, and more time is required to generate enough plasma to fully encompass the entire triangular portion 134. As a consequence, the full conductivity of the largest SCR segment is slightly delayed by the cathode resistors 139. The longer axis of the elliptical cathode resistors 139 (FIG. 1) points toward the rectangular portion 136 in order not to inhibit the spread of the plasma 150 at the outer portion of the triangular shaped portions 134. The larger SCR segment 22 at the locations "f" (FIG. 1) requires a larger volume of carriers and further smoothes the turn-on characteristics of the thyristor 10. The full conductivity of the thyristor 10 as shown in FIGS. 2 and 3 is thus eventually established at time $T_7$ and is physically represented by the plasma 150 shown in FIGS. 13A and 13B.

It can therefore be seen that the spread of the plasma 150 starts in a narrow area defined by the tabs 118 of the center portion 116 and interacts with the bridge portions 136, the top P+ portion 104 and the N− region 100. This interaction in essence establishes a small transistor 66 (FIG. 1) which collects current. This current establishes a small SCR which also conducts a minimal amount of current. As the plasma spreads, its spread is first inhibited by the depth-wise diffusion gradient of the bottom P++ material 106, and slightly later by the lateral diffusion gradient between the P++ region 106 and the P+ region 110. The plasma spread is also slowed as it encounters progressively larger areas constituting larger SCR segments 22. The thyristor is not fully conductive until the plasma has reached a full conduction volume as a result of all of the SCR segments 22 becoming fully conductive.

To become fully conductive, the plasma must spread throughout the SCR portion 13 (FIG. 1) of the thyristor structure. This spread is controlled both by the shape of the triangle and rectangle portions 134 and 136 of the bottom N+ region 114 and by the diffusion gradients within the bottom I shaped P++ region 106 and between the P++ region 106 and the bottom P+ region 110. As a result, a time delay in the expansion of the plasma and the conductivity of the SCR segments occurs. The turn-on current of the thyristor starts slowly and increases in magnitude over a finite time as is shown at 62 in FIG. 3, rather than occurring more instantaneously as shown at 64 in FIG. 3.

The thyristor 10 functions in a very similar manner when the voltage of terminal 18 is positive with respect to terminal 16, such as when terminal 16 is grounded and terminal 18 is held at a positive voltage. In this condition, the SCR portion 11 formed by the SCR segments 20 and the gate SCR transistors 44 and 46 becomes conductive. In this case the SCR segments 22 are reverse biased and are therefore not conductive.

Figure 14A:
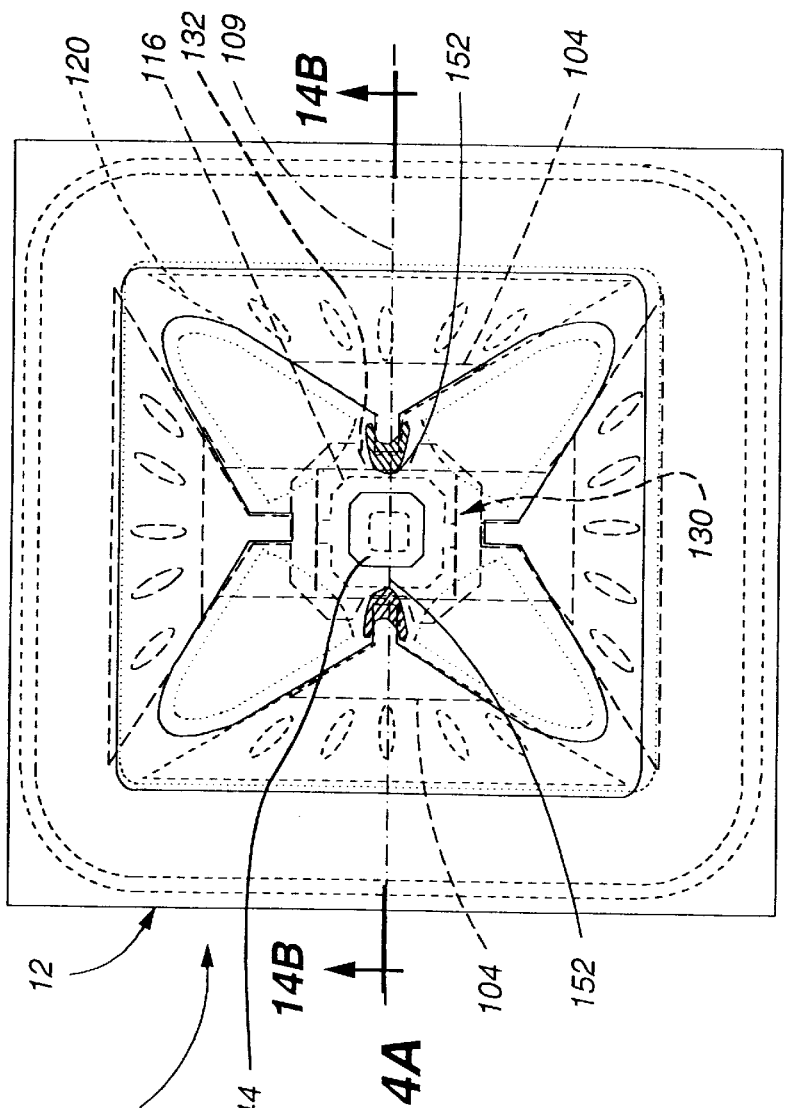
FIGS. 14A and 14B are views of FIGS. 4 and 5, respectively, illustrating a plasma of carriers at a first point in time after a trigger signal has been applied to the thyristor when a voltage of the opposite polarity of that shown in FIGS. 10A and 10B is applied across the thyristor.
Figure 14B:
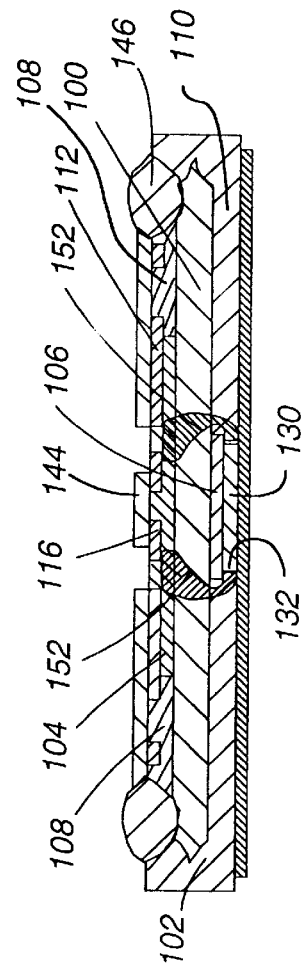

FIGS. 14A and 14B illustrate this polarity circumstance with a negative trigger signal applied to the gate terminal 144 at the ring structure 116. A cloud or plasma 152 initiates from the indentions 132 of the center portion 130 of the bottom N+ region 114 and flows around the edges of the bottom P++ region 106, through the middle N− region 100, through the top P++ region 104, and to the top N+ ring structure 116 at a location near the horizontal reference line 109. As the plasma 152 penetrates the top region 104, it encounters an increasingly greater potential from the depth-wise increasing gradient of P++ material of the top region 104. The increasing diffusion gradient of P++ material in the region 104 impedes the recombination times of the carriers, thereby slowing the progress of the plasma as it spreads. The plasma progresses through the top P++ region 104 and interacts initially with the edges of the ring structure 116 of the top N+ material 112 at the reference line 109. The relatively small edges of the ring structure 116 and the relatively small indentions 132 of the center portion 130 of the bottom region 114, along with the bottom P++ region 106 and the bottom P+ region 110, create the relatively small SCR gate transistors 44 and 46 (FIG. 1). A relatively small amount of current conducted by the gate SCR transistors 44 and 46 initially establishes current flow between the terminals 16 and 18 (FIG. 1), such as that which might exist at time $T_1$, as shown in FIGS. 2 and 3. This initial current flow is shown by the plasma 152 in FIGS. 14A and 14B. The initial current flow also forward biases the lateral transistor 48 (FIG. 1) existing between the ring structure 116 and the neck portions 122 of the triangular portions 120 of the top N+ material 112.

The current conducted through the gate SCR transistors 44 and 46 causes the voltage at node 52 to approach the level of the trigger signal at the gate 14 (FIG. 1). The decreasing voltage at node 52 biases the SCR segment 20 at the locations "a" into conduction and causes the plasma cloud 152 to grow in size as shown in FIGS. 15A and 15B. In order for the plasma 152 to grow, it must spread in a lateral sense (horizontally along line 109 as shown in FIG. 15A and 15B) to encompass more of the area of the P++ material of the top region 104 and to encompass the bottom P+ region 110. The diffusion gradient of the region 104 inhibits the growth of the plasma 152, thereby slightly delaying the onset of full conductivity of the SCR segment 20 connected at the locations "a" (FIG. 1). Furthermore, the increased size of the SCR segment requires more plasma to achieve saturated conduction, and added time is required to generate those carriers. The complete conductivity of the SCR segment 20 at the locations "a" increases the current conducted between the terminal 18 and 16, so a conductivity condition such as that represented at time $T_2$ as shown in FIGS. 2 and 3 exists, for example. As the plasma 152 grows, the orientation of the top P++ region 104 retards its growth, because the orientation of the top P++ region 104 is along the path of expansion of the spreading plasma as shown in FIGS. 15A and 15B.

As the SCR segment 20 at the locations "a" becomes fully conductive, the plasma 152 continues to spread as shown in FIGS. 15A and 15B. The plasma expands along the top P++ region 104 where the depth-wise doping gradient within the region 104 inhibits the expansion of the plasma 152. The plasma 152 grows to encompass the inner portion of the triangle portions 120 of the top N+ material of the region 112. The increased area of the triangular portions 120 of the top N+ region 112 creates the SCR segment 20 at the locations "b" (FIG. 1) which has larger transistors, and more current is required by these larger transistors to make them achieve saturation. The increased current flow is generally represented by the situation shown at time $T_3$ in FIGS. 2 and 3. The lobes 148 of insulating material confine the spread of plasma 152 from the center portion 130 of the bottom N+ region to the triangle portion 120 and neck portion 122 of the top N+ material of region 112.

Figure 16A:
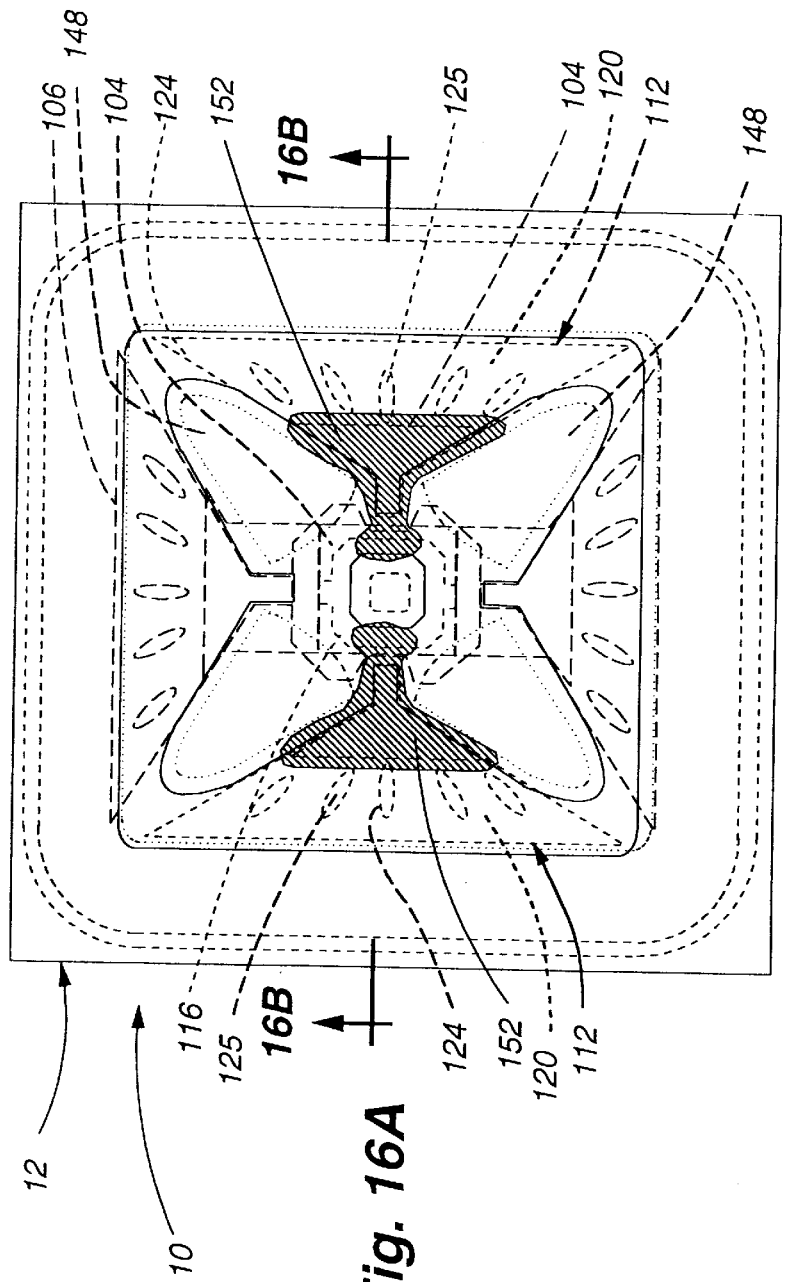
FIGS. 16A and 16D are views similar to FIGS. 14A and 14B illustrating the spread of the plasma at a third point in time more advanced after that point in time illustrated in FIGS. 15A and 15B.
Figure 16B:
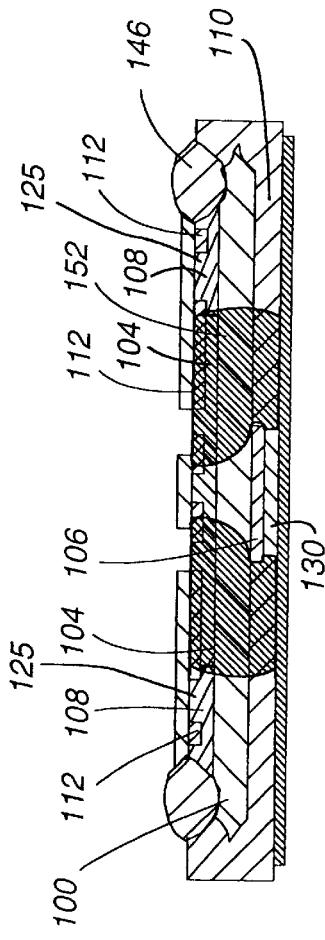

The increased current causes the plasma 152 to become larger as is shown in FIGS. 16A and 16B. Since the plasma 152 is attempting to spread beyond the longitudinal end points of the I shaped top P++ region 104, the band gap potential barrier created by the lateral differences in diffusion of the P++ material of the region 104 and the P+ material of the adjoining region 108 inhibits the spread of the plasma. The band gap potential difference created by the lateral diffusion gradient in the P+ and P++ regions inhibits the growth of the plasma until the band gap potential is overcome.

Figure 17A:
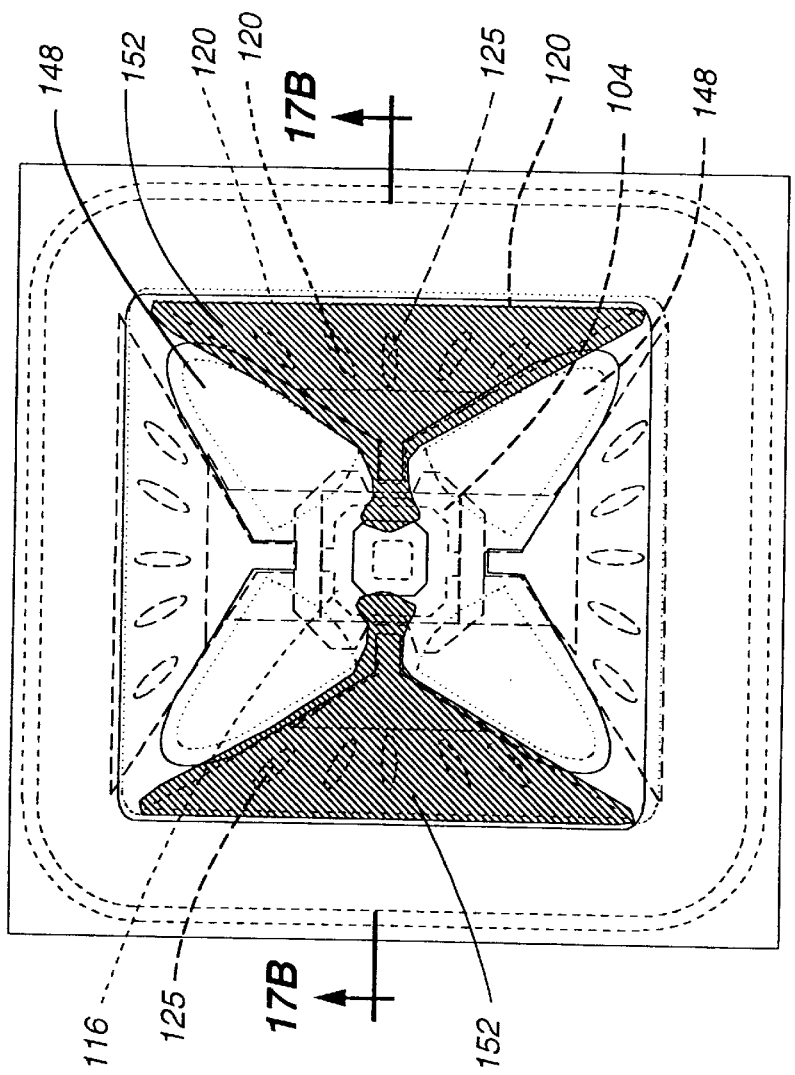
FIGS. 17A and 17B are views similar to FIGS. 14A and 14B illustrating the spread of the plasma at a fourth point in time more advanced after that point in time illustrated in FIGS. 16A and 16B.
Figure 17B:
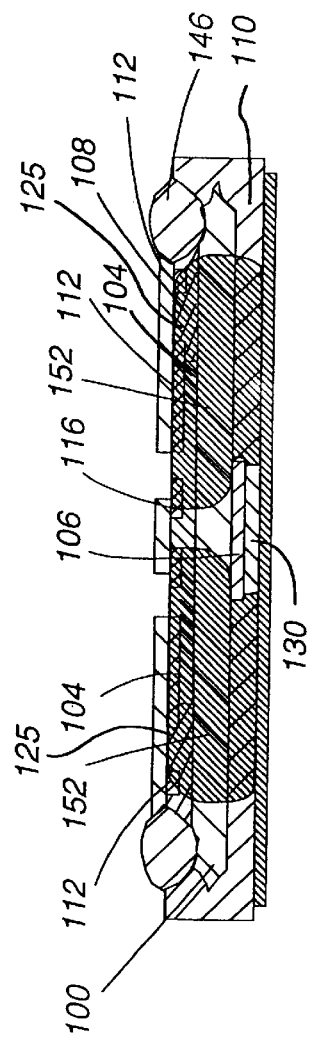

The plasma 152 becomes larger as is shown in FIGS. 17A and 17B. The spreading plasma has overcome the band gap potential barrier of the lateral diffusion gradient of the P++ region 104 and the P+ region 108. The plasma 152 spreads into the outer larger portions of the triangle portion 120 of N+ top region 112. The larger triangular portion of the region 112 encountered by the plasma in effect constitute a larger SCR segment 20 at the locations "c" (FIG. 1).

The larger size of the SCR segment at the locations "c" requires the plasma to build to an even greater level before conductive saturation is achieved. A lateral sheet resistance in the P+ material of the region 108 just below its interface with the N+ material of the triangular portion 120 of the region 112 establishes a lateral resistance between the projections of the P+ material into the elliptical openings 124. This interface lateral resistance is one of the components of the cathode resistor 125. The vertical resistance of the P+ material projecting into the elliptical openings 124 creates another component of the cathode resistance 125. Both the lateral and the vertical resistive components are combined in the single resistor 125 shown schematically in FIG. 1, as is typically understood. The cathode resistance 125 diverts some of the spreading plasma, and more time is required to generate enough plasma to fully encompass the entire triangular portion 120. As a consequence, the full conductivity of the largest SCR segment is slightly delayed by the cathode resistors 125. The longer elliptical axis of the cathode resistors 125 (FIG. 1) points toward the neck portion 122 in order not to directly inhibit the spread of the plasma 152 at the outer portion of the triangular shaped portions 120. The larger SCR segment 20 at the locations "c" are delayed in turning-on to further smooth the turn-on characteristics of the thyristor 10. The full conductivity of the thyristor 10 as shown at time $T_7$ in FIGS. 2 and 3, is thus eventually established, and is physically represented by the plasma shown in FIGS. 17A and 17B.

It can therefore be seen that the spread of the plasma 152 starts in a narrow area defined by the indentations 132 of the center portion 130 of the bottom N+ region 114, the neck portions 122 of the top N+ region 112 and the P++ region 104 that extends between the neck portions 122 and the ring portion 116. A small SCR segment is established which conducts only a minimal amount of current. As the plasma spreads, its spread is first inhibited by the depth-wise diffusion gradient potential barrier of the top P++ region 104, and thereafter by the band gap potential barrier resulting from the lateral diffusion gradient between the top P++ region 104 and the top P+ region 108. The plasma spread is also inhibited as it encounters the progressively larger triangular areas constituting larger SCR segments 20. Progressively, more current is conducted until the thyristor is fully turned on as a result of all of the SCR segments 20 becoming fully conductive.

To become fully conductive, the plasma must spread throughout the SCR portion 11 (FIG. 1) of the thyristor. This spread is controlled both by the shape of the triangle and rectangular portions 120 and 122 of the top N+ region 112 and by the diffusion gradients within and between the top P++ region 104 and the top P+ region 108. As a result, a delay in the expansion of the plasma and the conductivity of the SCR segments occurs. The turn-on current of the thyristor starts slowly and increases in magnitude over a finite time as is shown in FIG. 3, rather than occurring more instantaneously as shown at 64 in FIG. 3.

The shape of the regions within structure 12 of the thyristor 10 can significantly affect the time and transition characteristics when the thyristor is turned on. The shapes disclosed above are those which have been determined to be a compromise between the longest turn-on time and hence the greatest smoothness in transition, and the avoidance of localized heating. As can be appreciated, once the smaller SCR segments have been fully turned on and are conductive, greater current flow is directed through those limited areas during the time when the plasma spreads to the other areas of the structure. If the size of those limited areas is not sufficiently large to distribute the heat created by the current flow, a destructive effect may result. Thus, the shape of the conductive regions of the thyristor must accommodate localized heating effects. Other shapes and diffusion gradients which achieve a slowed or inhibited progress of the conductive plasma of carriers to turn-on the SCR segments are possible.

Another useful feature of the shape of the thyristor lay-out described above is that it is relatively easily scaled to different sizes. The symmetrical layout of the regions of the thyristor structure 12, progressing outward from the center of the structure, contributes significantly to its ability to be scaled for different current conductivity capacities. The so-called edge-fired and corner-fired SCRs are not capable of such convenient size scaling. Scaled different sizes of the thyristor achieve different current conductivity capabilities.

The thyristor of the present invention may also be formed with high temperature operational characteristics such as those described in a related to U.S. patent application Ser. No. 08/257,899, filed Jun. 10, 1994, for High Temperature, High Holding Current Semiconductor Thyristor, which is also assigned to the assignee hereof. The disclosure of Ser. No. 08/257,899 is incorporated herein by this reference. More specifically, presently preferred doping concentrations which achieve both the high temperature operation described in the U.S. application Ser. No. 08/257,899 and the features described herein are seen from the doping profile shown in FIG. 18.

Figure 18:
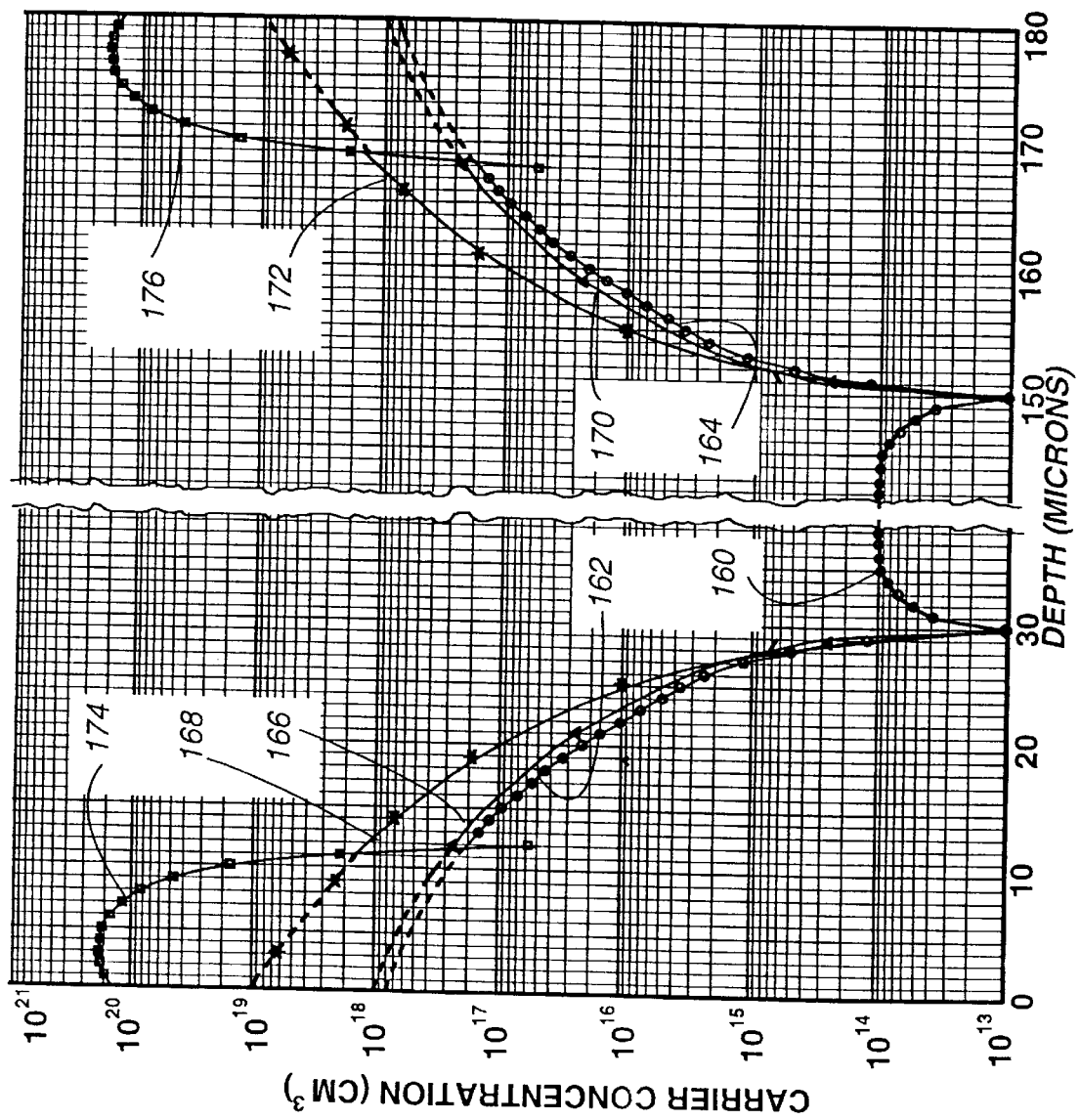
FIG. 18 is a graph of an exemplary doping profile of the thyristor shown in FIGS. 4–7B.

FIG. 18 illustrates an exemplary situation where the thickness of the thyristor structure 12 (FIGS. 5 and 6) is approximately 180 microns. The N− region 100 begins approximately 35 microns from the top surface of the structure 12 and ends about 35 microns from the bottom surface, at about 145 microns measured from the top surface. The N− doping concentration is about 1 E14 carriers and is represented by the curve segment 160. The doping concentration of the top P+ region 108 and the bottom P+ region 110 are shown by the curve portions 162 and 164. The regions 108 and 110 begin at the top and bottom surfaces of the structure and extend inwardly about 35 microns. The concentrations of the regions 108 and 110 at the surfaces are about 6.747 E17 carriers. The top P++ region 104 has a gradient of carrier concentrations shown between the curves 166 and 168. The lower curve 166 would intersect the top surface with a carrier concentration of about 1 E18 carriers, and the upper curve 168 would intersect the top surface with a carrier concentration of about 1 E19 carriers. The area between the curves 162 and 166 is a depletion region which inherently exists at the boundary between the regions. The P++ region curves 166 and 168 both end at approximately the same location of the curve 162, at about the 30 micron position. Similarly, the bottom P++ region 106 has a gradient of carrier concentrations shown between the curves 170 and 172. The lower curve 170 would intersect the bottom surface with a carrier concentration of about 1 E18 carriers, and the upper curve 172 would intersect the bottom surface with a carrier concentration of about 1 E19 carriers. The area between the curves 170 and 172 is a depletion region which inherently exists at the boundary between the regions. The P++ region curves 170 and 172 both end at approximately the same location of the curve 164, at about the 145 micron position. The curves 174 and 176 represent the doping concentrations of the top N+ region 112 and the bottom N+ region 114. The curves 174 and 176 intersect the top and bottom surfaces with carrier concentrations of about 2 E20 carriers. The doping of the top and bottom N+ regions terminates at a depth of about 12 microns from the surfaces (12 micron position and 168 micron position). Other doping concentrations are possible.

The turn-on transition between a non-conductive state and a fully conductive state achieved by the thyristor 10 of the present invention is considerably more gradual than known prior art thyristors, thereby avoiding the instantaneous and discontinuous transitions typical in prior art thyristors. By avoiding the instantaneous and discontinuous turn-on characteristics through a smoother and more lengthy turn-on transition time period as described above, the interference signals generated by the switching of the thyristor itself are significantly diminished. Preliminary investigations have shown that the magnitude of the interference signals generated by a thyristor of the present invention is on the order of 30 times less than the magnitude of the interference signals generated by a conventional thyristor not embodying the principles of the present invention.

A presently preferred embodiment of the present invention and many of its improvements have been described with a degree of particularity. This description is of a preferred example for implementing the invention, but the scope of the invention should not necessarily be limited by this description. The scope of the present invention is defined by the following claims.

The invention claimed is:

1. A semiconductor thyristor having a relatively smooth turn-on conduction transition characteristic and which is formed by multiple different semiconductor layers arranged in a predetermined configuration which confines a plasma of carriers to flow initially between layers in a predetermined localized volume at the beginning of the turn-on transition and to spread from the localized volume over a finite time to a predetermined considerably larger full conduction volume upon attaining complete conduction at the end of the turn-on transition, wherein:

the thyristor is a triac formed by two silicon controlled rectifier (SCR) structures arranged back-to-back in five semiconductor layers;

a middle semiconductor layer is common to both SCR structures;

two upper semiconductor layers and the middle semiconductor layer form one SCR structure;

two lower semiconductor layers and the middle semiconductor layer form the other SCR structure;

the two upper semiconductor layers include regions formed in a first predetermined configuration;

the two lower semiconductor layers include regions formed in a second predetermined configuration;

the first predetermined configuration is substantially similar in geometrical shape to the second predetermined configuration; and the first predetermined configuration of the upper two layers of one SCR structure is rotated approximately 90° with respect to the second predetermined configuration of the lower two layers of the other SCR structure.

2. A semiconductor thyristor as defined in claim 1, wherein each SCR structure is center-fired.

3. A semiconductor thyristor as defined in claim 1, wherein:

the first and second configurations are rotated about a point relative to one another; and the point of relative rotation of the two SCR structures is approximately at a center point of each structure.

4. A semiconductor thyristor as defined in claim 3, wherein the localized volume of the plasma of carriers at the beginning of the turn-on transition begins near the center point and spreads outward to the full conduction volume at an edge of the SCR structure.

5. A semiconductor thyristor as defined in claim 4, wherein the plasma of carriers spreads generally in a diametrical relationship relative to the center point.

6. A semiconductor thyristor as defined in claim 5, wherein insulating lobes extend through the five semiconductor layers to confine the spread of the plasma of carriers between the lobes.

7. A semiconductor thyristor as defined in claim 6, wherein the insulating lobes extend generally at approximately 90° rotational intervals about the center point.

8. A semiconductor thyristor as defined in claim 7, wherein an insulating barrier surrounds the two SCR structures.

9. A semiconductor thyristor as defined in claim 7, wherein each SCR structure includes a layer having a funnel-shaped segment located between the insulating lobes.

10. A semiconductor thyristor as defined in claim 7, wherein each SCR structure includes a layer having two funnel-shaped segments located between the insulating lobes, said two funnel-shaped segments oriented diametrically opposite one another relative to the center point.

11. A semiconductor thyristor as defined in claim 10, wherein:

each SCR structure includes a generally elongated rectangular segment located in a layer other than the layer in which the funnel-shaped segments are formed; and the elongated dimension of the rectangular segment extends generally perpendicular to the diametric opposite orientation of the two funnel-shaped segments.

12. A semiconductor thyristor having a relatively smooth turn-on conduction transition characteristic and which is formed by multiple different semiconductor layers arranged in a predetermined configuration which confines a plasma of carriers to flow initially between layers in a predetermined localized volume at the beginning of the turn-on transition and to spread from the localized volume over a finite time to a predetermined considerably larger full conduction volume upon attaining complete conduction at the end of the turn-on transition, wherein:

the thyristor comprises a silicon controlled rectifier (SCR) structure;

one layer includes a funnel-shaped segment having a shape which expands outward from a narrow end to a wide end; and the localized volume of the plasma of carriers at the beginning of the turn-on transition begins near the narrow end of the funnel-shaped segment and spreads outward along the funnel-shaped segment to the full conduction volume at the wide end.

13. A semiconductor thyristor as defined in claim 12, wherein:

a pair of elongated insulating lobes are formed through at least the layer which includes the funnel-shaped segment; and each insulating lobe extends generally along sides of the funnel-shaped segment which extend between the narrow end and the wide end.

14. A semiconductor thyristor having a relatively smooth turn-on conduction transition characteristic and which is formed by multiple different semiconductor layers arranged in a predetermined configuration which confines a plasma of carriers to flow initially between layers in a predetermined localized volume at the beginning of the turn-on transition and to spread from the localized volume over a finite time to a predetermined considerably larger full conduction volume upon attaining complete conduction at the end of the turn-on transition wherein:

one of the layers includes a relatively small gate segment;

another of the layers includes a generally expanded segment having a shape which expands laterally outward from a narrow end to a wide end;

the localized volume of the plasma of carriers flows between the gate segment and the narrow end of the expanded segment at the beginning of the turn-on transition; and the plasma of carriers increases to the full conduction volume by spreading outward to encompass the wide end of the expanded segment.

15. A semiconductor thyristor as defined in claim 14, wherein one of the layers includes insulating barriers to confine the flow of the plasma of carriers along the expanded segment.

16. A semiconductor thyristor comprising multiple, generally-parallel layers of semiconductor material arranged in a structure having opposite sides, each layer having regions of predetermined configurations, a first layer of the structure having an expanded region of a predetermined configuration which extends in the first layer from a relatively smaller area to a relatively larger area, a second layer located interiorly within the structure relative to the first layer and having an elongated region extending along the expanded region of the first layer, the elongated region having a depth-wise diffusion gradient providing an increasing potential barrier to a flow of carriers through the elongated region in a direction from a position farther from the first layer to a position closer to the first layer, and a third layer positioned in the structure with the second layer located between the first and third layers, the third layer including an initiation region generally located perpendicularly from the smaller area of the expanded region, the thyristor switching into a current conduction state by first initiating a flow of a plasma of carriers between the initiation region and the smaller area of the expanded region and through the elongated region and thereafter spreading the plasma of carriers to encompass a remainder of the expanded region and the elongated region, the configuration of the expanded region and the diffusion gradient of the elongated region increasing the time required for the plasma to spread to encompass the expanded region, the increased time to spread the plasma smooths the current conduction turn-on transition characteristic of the thyristor.

17. A semiconductor thyristor as defined in claim 16 wherein the second layer further includes an adjacent region located adjacent to an end of the elongated region, the elongated region and the adjacent region having different diffusion characteristics to establish a lateral diffusion differential between the end of the elongated region and the adjacent region, the expanded region of the first layer extending beyond the end of the elongated region to require the plasma to spread beyond the end of the elongated region to completely encompass the expanded region, the lateral diffusion differential between the end of the elongated region and the adjacent region establishing a band gap potential barrier to the spread of the plasma beyond the end of the elongated region, the band gap potential barrier further increasing the time required for the plasma to spread to completely encompass the expanded region.

18. A semiconductor thyristor as defined in claim 17 further comprising insulating lobes formed in the structure adjacent to edges of the expanded region to confine the spread of the plasma to the expanded region in the first layer.

19. A semiconductor thyristor as defined in claim 18 wherein the relatively smaller area of the expanded region of the first layer, a center area of the elongated region of the second layer and the initiation region of the third layer are located generally centrally within the structure, and configurations of the regions within the first, second and third layers are scalable in size to establish different maximum current conductivity characteristics of the thyristor.

20. A semiconductor thyristor as defined in claim 17 wherein the expanded region of the first layer is generally triangularly shaped and the elongated region of the second layer is generally I shaped.

* * * * *